United States Patent
Kaga et al.

(10) Patent No.: US 9,508,555 B2
(45) Date of Patent: Nov. 29, 2016

(54) METHOD OF MANUFACTURING SEMICONDUCTOR DEVICE

(71) Applicant: Hitachi Kokusai Electric Inc., Tokyo (JP)

(72) Inventors: Yukinao Kaga, Toyama (JP); Arito Ogawa, Toyama (JP); Atsuro Seino, Toyama (JP); Atsuhiko Ashitani, Toyama (JP); Ryohei Maeno, Toyama (JP); Masanori Sakai, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 15 days.

(21) Appl. No.: 14/226,145

(22) Filed: Mar. 26, 2014

(65) Prior Publication Data
US 2014/0295667 A1 Oct. 2, 2014

(30) Foreign Application Priority Data

Mar. 28, 2013 (JP) .................. 2013-069116
Mar. 10, 2014 (JP) .................. 2014-046364

(51) Int. Cl.
*H01L 21/285* (2006.01)
*C23C 16/34* (2006.01)
(Continued)

(52) U.S. Cl.
CPC ......... *H01L 21/28562* (2013.01); *C23C 16/34* (2013.01); *C23C 16/45527* (2013.01); *C23C 16/45546* (2013.01); *C23C 16/45557* (2013.01); *H01L 21/76843* (2013.01)

(58) Field of Classification Search
CPC ................ H01L 21/28556; H01L 21/28562; H01L 21/76843

USPC ........................................... 438/680
See application file for complete search history.

(56) References Cited

U.S. PATENT DOCUMENTS

| 6,270,572 | B1 | 8/2001 | Kim et al. |
| 8,257,789 | B2 | 9/2012 | Matsunaga et al. |

(Continued)

FOREIGN PATENT DOCUMENTS

| JP | 2012069998 A | 4/2012 |
| JP | 2012104719 A | 5/2012 |
| JP | 2012231123 A | 11/2012 |

OTHER PUBLICATIONS

"Density Funtional Study on the Adsorption and Surface Reactions on SIO2 in TiN-CVD Using TiCl4 and NH3", Thin Solid Film 409 (2002) 51-57.*

(Continued)

*Primary Examiner* — Bilkis Jahan
*Assistant Examiner* — Nga Doan
(74) *Attorney, Agent, or Firm* — Edell, Shapiro & Finnan LLC

(57) ABSTRACT

To improve quality or manufacturing throughput of a semiconductor device, a method includes supplying a source gas to a substrate in a process chamber; exhausting an inside of the process chamber; supplying a reaction gas to the substrate; and exhausting the inside of the process chamber, wherein the source gas and/or the reaction gas is supplied in temporally separated pulses in the supply of the source gas and/or in the supply of the reaction gas. Then, the source gas and/or the reaction gas is supplied in temporally separated pulses to form a film during a gas supply time determined by a concentration distribution of by-products formed on a surface of the substrate.

8 Claims, 21 Drawing Sheets

(51) Int. Cl.
*C23C 16/455* (2006.01)
*H01L 21/768* (2006.01)

(56) References Cited

U.S. PATENT DOCUMENTS

2005/0054196 A1* 3/2005 Wu .................. H01L 21/28562
　　　　　　　　　　　　　　　　　　　　　　　　438/680
2010/0297846 A1* 11/2010 Kaga ...................... C23C 16/34
　　　　　　　　　　　　　　　　　　　　　　　　438/680
2011/0183519 A1* 7/2011 Kaga ...................... C23C 16/34
　　　　　　　　　　　　　　　　　　　　　　　　438/680
2013/0164936 A1 6/2013 Oshimo et al.

OTHER PUBLICATIONS

"Study on the Characteristics of TiN Thin Film Deposited by the Atomic Layer Chemical Vapor Deposition Method", 2000 American Vacuum Society.*

* cited by examiner

FIG. 15

| NH₃ Flow | Normal Flow (Continuous flow) | *Divided Flow* |
|---|---|---|
| Top | 7.1nm | 5.8nm |
| Bottom | 6.0nm | 5.8nm |
| Step Coverage (c/a) | 84.5% | *100%* |

METHOD OF MANUFACTURING SEMICONDUCTOR DEVICE

CROSS REFERENCE TO RELATED APPLICATIONS

This application claims foreign priority under 35 U.S.C. §119(a)-(d) to Application No. JP 2013-069116 filed on Mar. 28, 2013, and Application No. JP 2014-046364 filed on Mar. 10, 2014, entitled "Method of Manufacturing Semiconductor Device," the entire contents of each of which are hereby incorporated by reference.

FIELD OF THE INVENTION

The present invention relates to a method of manufacturing a semiconductor device.

BACKGROUND

According to recent high integration and high performance of semiconductor devices (integrated circuits (IC)), and particularly, DRAMs, technology for forming a uniform film thickness at a surface on a substrate and on a pattern surface is demanded. As one of techniques for satisfying such a demand, there is a method in which a plurality of sources are used to form a film on a substrate. This method enables conformal film-forming having high step coverage when, for example, a DRAM capacitor electrode and the like that have a particularly high aspect ratio, are formed. For example, this method is disclosed in Japanese Unexamined Patent Application No. 2012-231123, Japanese Unexamined Patent Application No. 2012-104719, and Japanese Unexamined Patent Application No. 2012-69998.

SUMMARY

Even when the above technique is used on recent substrates having a high aspect ratio pattern, a stereoscopic structure pattern, and a high pattern density, a loading effect within a substrate surface significantly occurs and it is difficult to obtain desired conformal film-forming, thereby degrading quality or manufacturing throughput of a semiconductor device. The present invention provides technology capable of improving quality or manufacturing throughput of the semiconductor device when a plurality of sources are used to form a film on the substrate.

According to an aspect of the present invention, there is provided a method of manufacturing a semiconductor device, comprising: (a) supplying a source gas to a substrate in a process chamber; (b) exhausting an inside of the process chamber; (c) supplying a reaction gas to the substrate; and (d) exhausting the inside of the process chamber, wherein at least one of the source gas and the reaction gas is supplied in temporally separated pulses to form a film on the substrate during a gas supply period determined by a concentration distribution of by-products formed on a surface of the substrate in at least one of the step (a) and the step (c).

BRIEF DESCRIPTION OF THE DRAWINGS

FIG. 15 is a diagram illustrating a result of the step coverage obtained in FIGS. 12 through 14.

DETAILED DESCRIPTION

Figure 1:
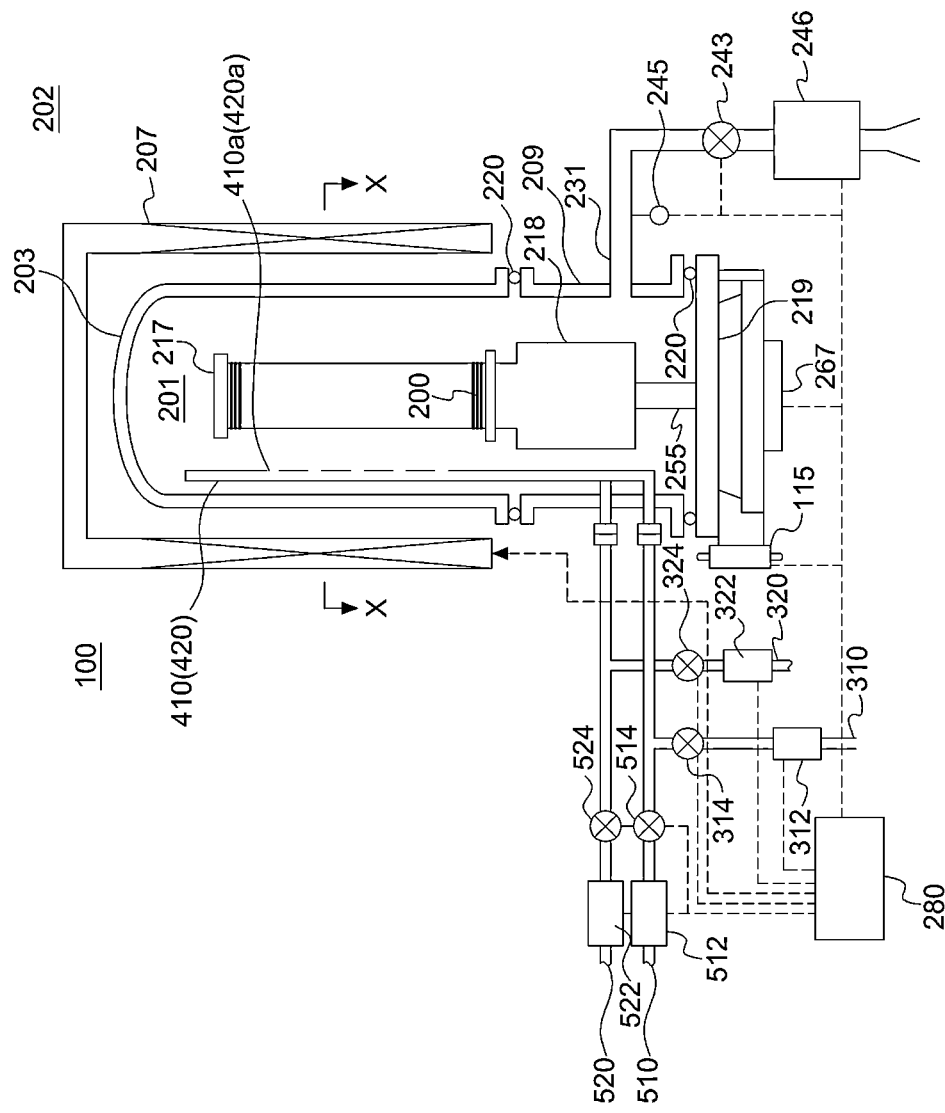
FIG. 1 is a schematic configuration diagram illustrating a processing furnace of a substrate processing apparatus preferably used in a first embodiment of the present invention and is a partial vertical cross-sectional view illustrating a portion of a processing furnace.

Hereinafter, exemplary embodiments of the present invention will be described.

The inventors have found that, while a source gas and a reaction gas are alternately supplied as a processing gas (to be described later), between a step of flowing the source gas and a step of flowing the reaction gas, when a gas is supplied in either or both of the steps, by-products that interfere with a reaction are generated, and thereby a substrate in which a structure having a high aspect ratio is formed or a substrate having a high pattern density has low process uniformity, which is a loading effect. In addition, the inventors have found that process uniformity on a surface of the substrate or each substrate is degraded when a substrate in which a structure having a high aspect ratio is formed, a substrate having a stereoscopic structure pattern formed therein, or a substrate having a high pattern density is accommodated and processed in a process chamber (to be described later) in a plurality of substrates. The inventors have found that these problems can be addressed by a substrate processing apparatus, a method of manufacturing a semiconductor device, and the like, which will be described below.

First Embodiment

Hereinafter, exemplary embodiments of the present invention will be described.

First, a substrate processing apparatus 100 will be described. In the following description, as an example of the substrate processing apparatus 100, a case in which a substrate processing apparatus, which is a batch-type vertical apparatus that performs a film-forming process and the like on a plurality of substrates at once, is used will be described. The substrate processing apparatus 100 is configured as an example of a device for manufacturing a semiconductor device used in a process among processes of manufacturing a semiconductor device.

Configuration of Processing Furnace

Next, a processing furnace 202 applied to the above substrate processing apparatus 100 will be described with reference to FIGS. 1 and 2.

A heater 207 serving as a heating unit (heating mechanism, heating system) for heating a wafer 200 is installed in the processing furnace 202. The heater 207 includes an insulation member having a cylindrical shape whose upper end is blocked and a plurality of heater wires, and includes a unit configuration in which the heater wire is installed in the insulation member. In the heater 207, a reaction tube 203 composing a reaction container (process container) is concentrically provided with respect to the heater 207. The reaction tube 203 is made of a heat-resistant material such as quartz ($SiO_2$) or silicon carbide (SiC) and is formed in a cylindrical shape whose upper end is blocked and lower end is opened. In the lower end of the reaction tube 203, a manifold 209 is installed through an O ring 220 serving as an airtight member by, for example, stainless steel. A lower-end opening of the manifold 209 is air-tightly closed by the seal cap 219 serving as a furnace port lid through the O ring 220. A process chamber 201 is formed by at least the reaction tube 203, the manifold 209, and the seal cap 219. In the seal cap 219, a boat 217 serving as a substrate support member, which is a substrate support unit (substrate support), through a boat support 218, is provided, and the boat support 218 is configured as a holding body holding and supporting the boat. A plurality of wafers 200 to be batch-processed are horizontally stacked on the boat 217 in a tube axis direction in multiple stages. Also, the boat 217 is raised and lowered (enter and exit) by a boat elevator 115 with respect to the reaction tube 203. In order to improve process uniformity, a boat rotating mechanism 267 configured to rotate the boat 217 is installed in a lower end portion of the boat support 218. By driving the boat rotating mechanism 267, it is possible to rotate the boat 217 supported by the boat support 218. The heater 207 heats the wafer 200 inserted into the process chamber 201 to a predetermined temperature.

A nozzle 410 and a nozzle 420 are installed in the process chamber 201 so as to penetrate a lower portion of the reaction tube 203. In the nozzle 410 and the nozzle 420, gas supply pipes 310 and 320 are connected, respectively, as gas supply lines. In this manner, the two nozzles 410 and 420, and the two gas supply pipes 310 and 320 are installed in the reaction tube 203, and a plurality of kinds of gases, two kinds of gases (processing gas) herein, may be supplied into the process chamber 201.

In the gas supply pipe 310, in order from an upstream end, a mass flow controller (MFC) 312 serving as a flow rate control device (flow rate controller) and a valve 314 serving as an on-off valve are installed. The nozzle 410 is connected to a front end of the gas supply pipe 310. The nozzle 410 is configured as an L-shaped long nozzle and is installed such that a horizontal portion thereof penetrates a sidewall of the manifold 209. A vertical portion thereof is installed in an arc-shaped space between an inner wall of the reaction tube 203 and the wafer 200 to extend upward in a direction in which the wafers 200 are stacked from the lower inner wall of the reaction tube 203 to the upper inner wall thereof (that is, extends upward from one end side to the other end side of the wafer arrangement region). In other words, the nozzle 410 is installed along the wafer arrangement region in which the wafer 200 is arranged, in a region that horizontally surrounds the wafer arrangement region at sides of the wafer arrangement region. A gas supply hole 410a is installed in a side surface of the nozzle 410 to supply a gas. The gas supply hole 410a is opened toward the center of the reaction tube 203. A plurality of gas supply holes 410a are installed from a lower portion of the reaction tube 203 to an upper portion thereof, each having the same or a tapered size opening area, and are also installed at the same opening pitch.

Also, a carrier gas supply pipe 510 configured to supply a carrier gas is connected to the gas supply pipe 310. An MFC 512 and a valve 514 are installed in the carrier gas supply pipe 510.

In the gas supply pipe 320, in order from an upstream end, an MFC 322 serving as a flow rate control device (flow rate controller) and a valve 324 serving as an on-off valve are installed. The nozzle 420 is connected to a front end of the gas supply pipe 320. The nozzle 420 is configured as an L-shaped long nozzle and is installed such that a horizontal portion thereof penetrates a sidewall of the manifold 209. A vertical portion thereof is installed in an arc-shaped space between an inner wall of the reaction tube 203 and the wafer 200 to extend upward in a direction in which the wafers 200 are stacked from the lower inner wall of the reaction tube 203 to the upper inner wall thereof (that is, extends upward from one end side to the other end side of the wafer arrangement region). In other words, the nozzle 420 is installed along the wafer arrangement region in which the wafer 200 is arranged, in a region that horizontally surrounds the wafer arrangement region at sides of the wafer arrangement region. A gas supply hole 420a is installed in a side surface of the nozzle 420 to supply a gas. The gas supply hole 420a is opened toward the center of the reaction tube 203. A plurality of gas supply holes 420a are installed from a lower portion of the reaction tube 203 to an upper portion thereof, each having the same or a tapered size opening area, and are also installed at the same opening pitch.

Also, a carrier gas supply pipe 520 is connected to the gas supply pipe 320 to supply a carrier gas. An MFC 522 and a valve 524 are installed in the carrier gas supply pipe 520.

As described above, in a method of supplying a gas according to the present embodiment, a gas is transferred through the nozzles 410 and 420 disposed in the vertically long arc-shaped space defined by the inner wall of the reaction tube 203 and ends of a plurality of stacked wafers 200, the gas is ejected into the first the reaction tube 203 near the wafer 200 from the gas supply holes 410a and 420a which are opened in the nozzles 410 and 420, respectively, and a main flow of the gas in the reaction tube 203 is set parallel to a surface of the wafer 200, that is, in a horizontal direction. In such a configuration, the gas may be equally supplied to each wafer 200, thereby uniformizing a film thickness of a thin film to be formed on each wafer 200. Also, a residual gas remaining after a reaction flows toward an exhaust port, that is, in a direction of an exhaust pipe 231 (to be described later), but a flowing direction of the residual gas is appropriately defined by a location of the exhaust port and is not limited to the vertical direction.

As an example according to the configuration, for example, titanium tetrachloride ($TiCl_4$), which is a metal-containing gas (metal compound) and is a Ti-containing gas which contains titanium (Ti) as a transition metal, and the like are supplied into the process chamber 201, as a source gas. Also, when a liquid source that is in a liquid state under normal temperature and normal pressure such as $TiCl_4$ is used, the liquid source is vaporized by a vaporizing system (not illustrated) such as a vaporizer or a bubbler and is then supplied as the gas. When the source gas described above is supplied from the gas supply pipe 310, a source gas supply system (source gas supply unit) mainly includes the gas supply pipe 310, the MFC 312, the valve 314, and the nozzle 410. The source gas supply system may also be called a source supply system (source supply unit). When a metal-containing gas is supplied from the gas supply pipe 310, the source gas supply system may also be called a metal-containing gas supply system (metal-containing gas supply unit). Also, the metal-containing gas supply system may also be called a metal source supply system (metal source supply unit). When a titanium-containing gas is supplied from the gas supply pipe 310, the source gas supply system may also be called a titanium-containing gas supply system (titanium-containing gas supply unit).

From the gas supply pipe 320, as a reaction gas that reacts with a source gas, for example, ammonia ($NH_3$), which is a nitrogen-containing gas containing nitrogen (N), or the like is supplied into the process chamber 201. When the reaction gas is supplied from the gas supply pipe 320, a reaction gas supply system (reaction gas supply unit) mainly includes the gas supply pipe 320, the MFC 322, the valve 324, and the nozzle 420. When the nitrogen-containing gas is supplied from the gas supply pipe 320, the reaction gas supply system may also be called a nitrogen-containing gas supply system (nitrogen-containing gas supply unit).

From the carrier gas supply pipes 510 and 520, for example, nitrogen ($N_2$) gas is supplied as an inert gas into the process chamber 201 through the MFCs 512 and 522, the valves 514 and 524, the gas supply pipes 510 and 520, and the nozzles 410 and 420, respectively. An inert gas supply system (inert gas supply unit) mainly includes the carrier gas supply pipes 510 and 520, the MFCs 512 and 522, and the valves 514 and 524. The inert gas supply system may also be called a purge gas supply system (purge gas supply unit) or a carrier gas supply system (carrier gas supply unit).

The exhaust pipe 231 is installed in the reaction tube 203 to exhaust an atmosphere in the process chamber 201. As illustrated in FIG. 2, as seen in a transverse cross-sectional view, the exhaust pipe 231 is installed in a side facing a side in which the gas supply hole 410a of the nozzle 410 and the gas supply hole 420a of the nozzle 420 of the reaction tube 203 are installed, that is, in a side opposite to the gas supply holes 410a and 420a through the wafer 200. Also, as illustrated in FIG. 1, as seen in longitudinal cross-sectional view, the exhaust pipe 231 is installed below a portion in which the gas supply holes 410a and 420a are installed. In such a configuration, a gas supplied from the gas supply holes 410a and 420a to near the wafer 200 in the process chamber 201 flows in a horizontal direction, that is, a direction parallel to a surface of the wafer 200, flows downward, and is exhausted from the exhaust pipe 231. A main gas flow in the process chamber 201 is a flow in a horizontal direction as described above.

In the exhaust pipe 231, in order from an upstream end, a pressure sensor 245 serving as a pressure detector (pressure detecting unit) configured to detect a pressure in the process chamber 201, an auto pressure controller (APC) valve 243 serving as an exhaust valve including a pressure regulator (pressure regulating unit), and a vacuum pump 246 serving as a vacuum exhaust device are connected. Also, in the exhaust pipe 231, a trap device for capturing reaction by-products in an exhaust gas, an unreacted source gas, and the like, and a detoxifying device for abating corrosive components, toxic components, and the like included in the exhaust gas may be connected. An exhaust system (exhaust unit), that is, an exhaust line, mainly includes the exhaust pipe 231, the APC valve 243, and the pressure sensor 245. The vacuum pump 246 may also be included in the exhaust system. The trap device or the detoxifying device may also be included in the exhaust system.

Also, while the vacuum pump 246 is operated, the APC valve 243 may perform vacuum-exhaust or vacuum-exhaust stop in the process chamber 201 by opening or closing a valve. Also, while the vacuum pump 246 is operated, a pressure in the process chamber 201 is adjusted by regulating a degree of valve opening. That is, while the vacuum pump 246 is operated, the exhaust system regulates a degree of opening of the APC valve 243 based on information on the pressure detected by the pressure sensor 245, and thereby an "actual pressure" in the process chamber 201 is able to be closer to a predetermined "set pressure." For example, when there is no change in a flow rate of a gas supplied into the process chamber 201 or supply of a gas into the process chamber 201 stops, in order to change the actual pressure in the process chamber 201, the set pressure in the process chamber 201 is changed and a degree of opening of the APC valve 243 is changed to a degree of opening according to the above set pressure. As a result, an exhaust capacity of the exhaust line is changed, and thereby the actual pressure in the process chamber 201 gradually becomes closer to the above set pressure (in a curve). As described above, the "set pressure" in the process chamber 201 may be considered as a "target pressure" when the pressure in the process chamber 201 is controlled, and the "actual pressure" in the process chamber 201 follows this value. Also, "the set pressure in the process chamber 201 is changed" substantially means that "the degree of opening of the APC valve 243 is changed in order to change the exhaust capacity of the exhaust line" and may be considered as "an instruction to change the degree of opening of the APC valve 243."

In the reaction tube 203, a temperature sensor 263 is installed as a temperature detector. Power supply to the heater 207 is adjusted based on information on the temperature detected by the temperature sensor 263, and thereby a temperature in the process chamber 201 has a desired temperature distribution. Similar to the nozzles 410, 420, and 430, the temperature sensor 263 is configured in an L shape, and is installed along an inner wall of the reaction tube 203.

Controller

Figure 3:
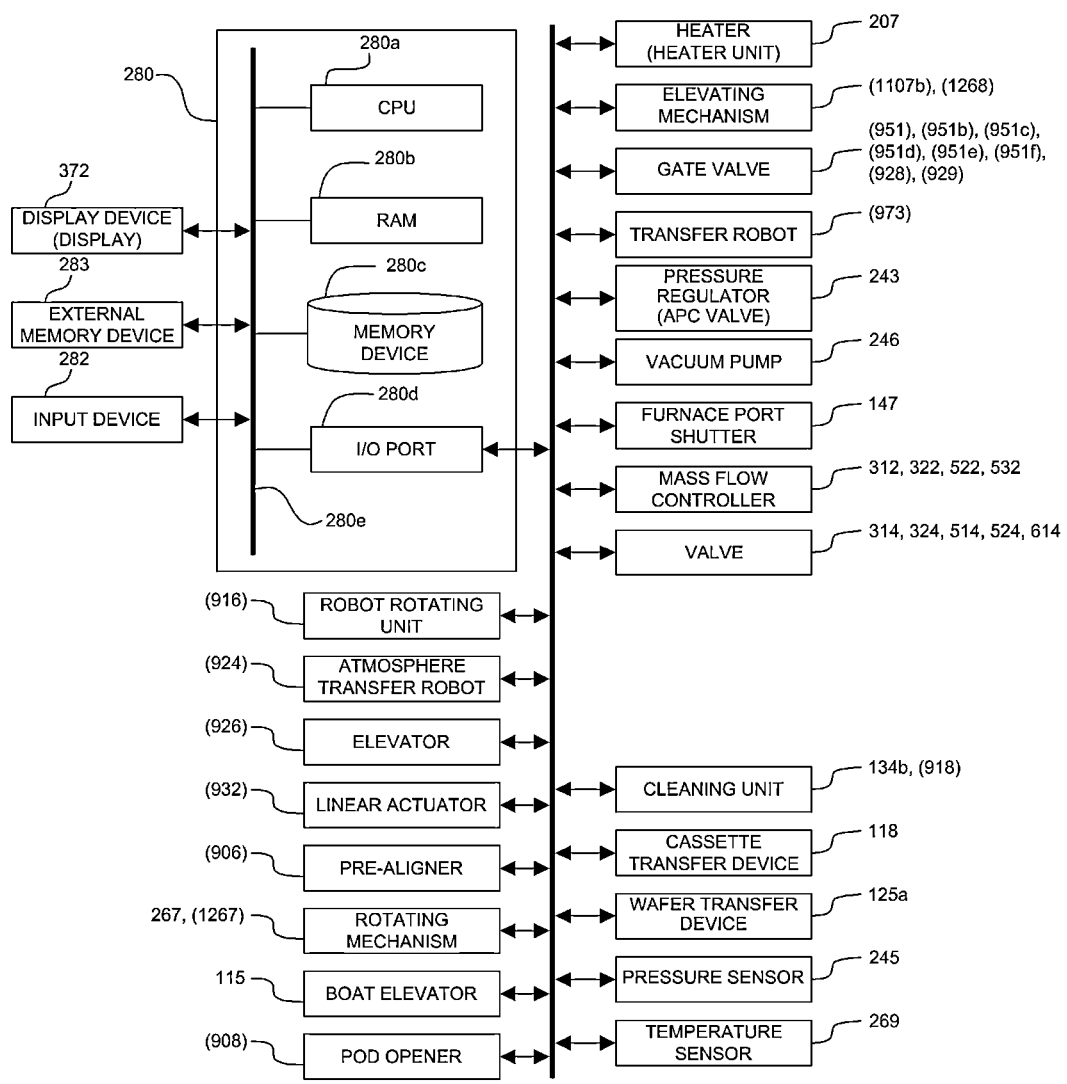
FIG. 3 is a schematic configuration diagram of a controller preferably used in the first embodiment.

FIG. 3 illustrates a connection example of a controller and each configuration according to the present embodiment. A controller 280 serving as a control unit (control device) is configured as a computer including a central processing unit (CPU) 280a, a random access memory (RAM) 280b, a memory device 280c, and an I/O port 280d. The RAM 280b, the memory device 280c, and the I/O port 280d are configured to exchange data with the CPU 280a through an internal bus 280e. An I/O device 282 configured as, for example, a touch panel, is connected to the controller 280.

The memory device 280c includes, for example, a flash memory and a hard disk drive (HDD). In the memory device 280c, a control program for controlling an operation of the substrate processing apparatus, a process recipe describing sequences, conditions, and the like of substrate processing (to be described later), and the like are readably stored. Also, the process recipe, which is a combination of sequences, causes the controller 280 to execute each sequence in a substrate processing process (to be described later) in order to obtain a predetermined result, and functions as a program. Hereinafter, the process recipe, the control program, and the like are collectively simply called a "program." Also, when the term "program" is used in this specification, it may refer to either or both of the process recipe and the control program. Also, the RAM 280b is configured as a memory area (work area) in which a program, data, and the like read by the CPU 280a are temporarily stored.

The I/O port 280d is connected to the MFCs 312, 322, 522, and 532, the valves 314, 324, 514, 524, and 6142, the pressure sensor 245, the pressure regulator 243 (APC valve), the vacuum pump 246, the heater 207, a temperature sensor 269, the rotating mechanism 267, the boat elevator 115, a wafer transfer device 125a, a cassette transfer device 118, a cleaning unit 134b, a furnace port shutter 147, and the like. Also, configurations denoted in parentheses in FIG. 3 are used in a device structure of a second embodiment or a third embodiment (to be described later), and may not be connected to a device of the first embodiment.

The CPU 280a reads and executes the control program from the memory device 280c, and reads the process recipe from the memory device 280c according to an input of a manipulating command from the I/O device 282 and the like. In addition, to comply with content of the read process recipe, the CPU 280a controls a flow rate adjustment operation of various kinds of gases by the MFCs 312, 322, 512, and 522, an opening and closing operation of the valves 314, 324, 514, 524, and 6142, an opening and closing operation of the APC valve 243, a pressure adjustment operation based on the pressure sensor 245 by the APC valve 243, a temperature adjustment operation of the heater 207 based on the temperature sensor 269, starting and stopping of the vacuum pump 246, a rotation and rotational speed regulating operation of the boat 217 by the rotating mechanism 267, a lifting operation of the boat 217 by the boat elevator 115, and the like.

Also, the controller 280 is not limited to a dedicated computer, and may be configured as a general-purpose computer. For example, the controller 280 according to the present embodiment may be configured by preparing an external memory device 283 storing the above program [for example, a magnetic tape, a magnetic disk such as a flexible disk and a hard disk, an optical disc such as a CD and a DVD, a magneto-optical disc such as an MO, and a semiconductor memory such as a USB memory (USB flash drive) and a memory card], and then installing the program in a general-purpose computer using the external memory device 283. Also, a method of supplying a program to a computer is not limited to using the external memory device 283. For example, a communication line such as the Internet or an exclusive line may be used to supply a program without using the external memory device 283. Also, the memory device 280c or the external memory device 283 is configured as a non-transitory computer-readable recording medium. Hereinafter, these are also collectively simply called a recording medium. Also, when the term "recording medium" is used in this specification, it refers to either or both of the memory device 280c and the external memory device 283.

Substrate Processing Process

Next, as a process of a manufacturing process of a semiconductor apparatus (semiconductor device) using the processing furnace of the substrate processing apparatus described above, a sequence example in which, for example, a titanium nitride (TiN) film, that is a conductive film and a metal-containing film, is formed as a transition metal nitride film on a substrate will be described with reference to FIGS. 4 and 5. Also, in the following description, operations of respective units constituting the substrate processing apparatus are controlled by the controller 280.

When the term "wafer" is used in this specification, it refers to the "wafer itself," or a "laminate (aggregate) of a wafer, a predetermined layer, film, and the like formed on a surface thereof" (that is, the wafer refers to a wafer including a predetermined layer, film, and the like formed on a surface thereof). In addition, when the term "surface of the wafer" is used in this specification, it refers to a "surface (exposed surface) of the wafer itself" or a "surface of a predetermined layer, film, and the like formed on the wafer, that is, the outermost surface of the wafer as the laminate."

Therefore, when it is described in this specification that "a predetermined gas is supplied to the wafer," it means that "a predetermined gas is directly supplied to a surface (exposed surface) of wafer itself" or "a predetermined gas is supplied to a layer, film, and the like formed on the wafer, that is, to the outermost surface of the wafer as the laminate." In addition, in this specification, it means that "a predetermined layer (or film) is formed on a layer or a film formed on the wafer, that is, a predetermined layer (or film) is formed on the outermost surface of the wafer as the laminate."

The terms "substrate" and "wafer" as used in this specification have the same meanings. Thus, the term "wafer" in the above description may be replaced with the term "substrate."

Hereinafter, a substrate processing process will be described.

Substrate Loading and Unloading Process (S101)

Figure 2:
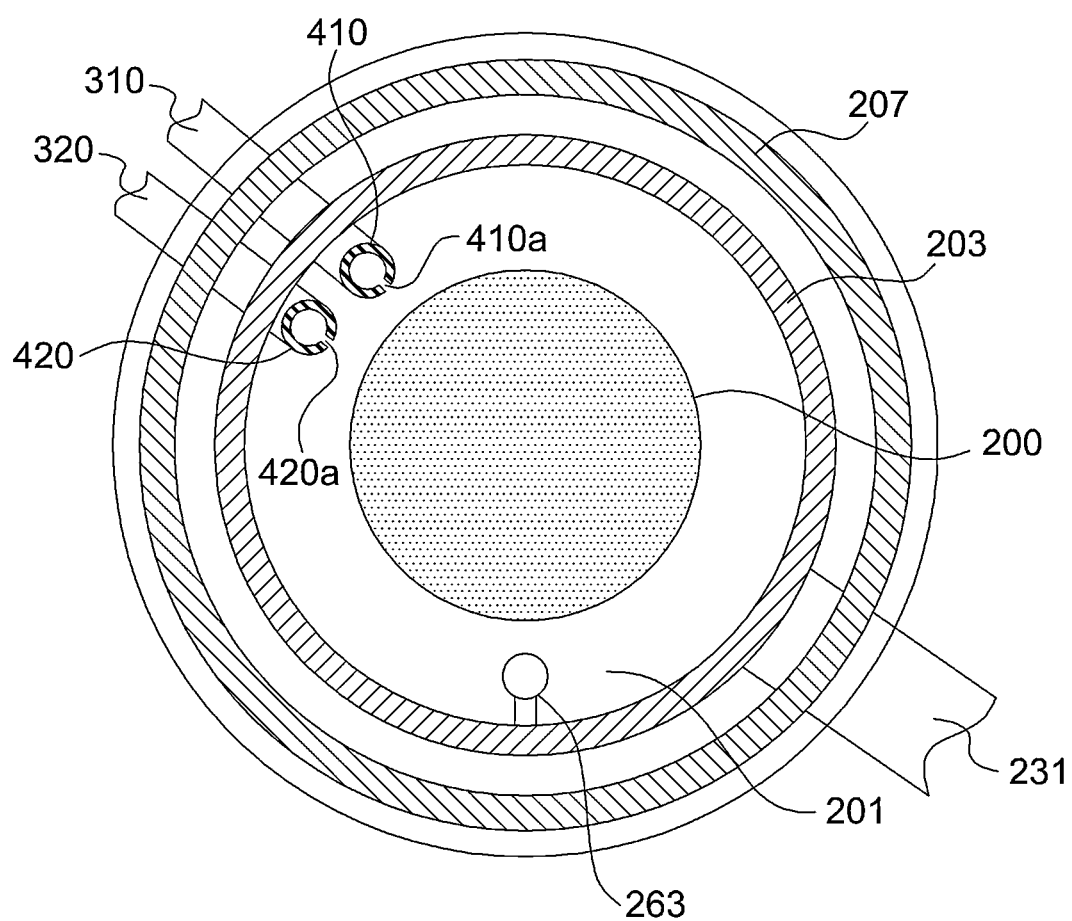
FIG. 2 is a schematic configuration diagram illustrating the processing furnace of the substrate processing apparatus preferably used in the first embodiment of the present invention and is a plane cross-sectional view illustrating the portion of the processing furnace taken along the line A-A of FIG. 1.
Figure 4:
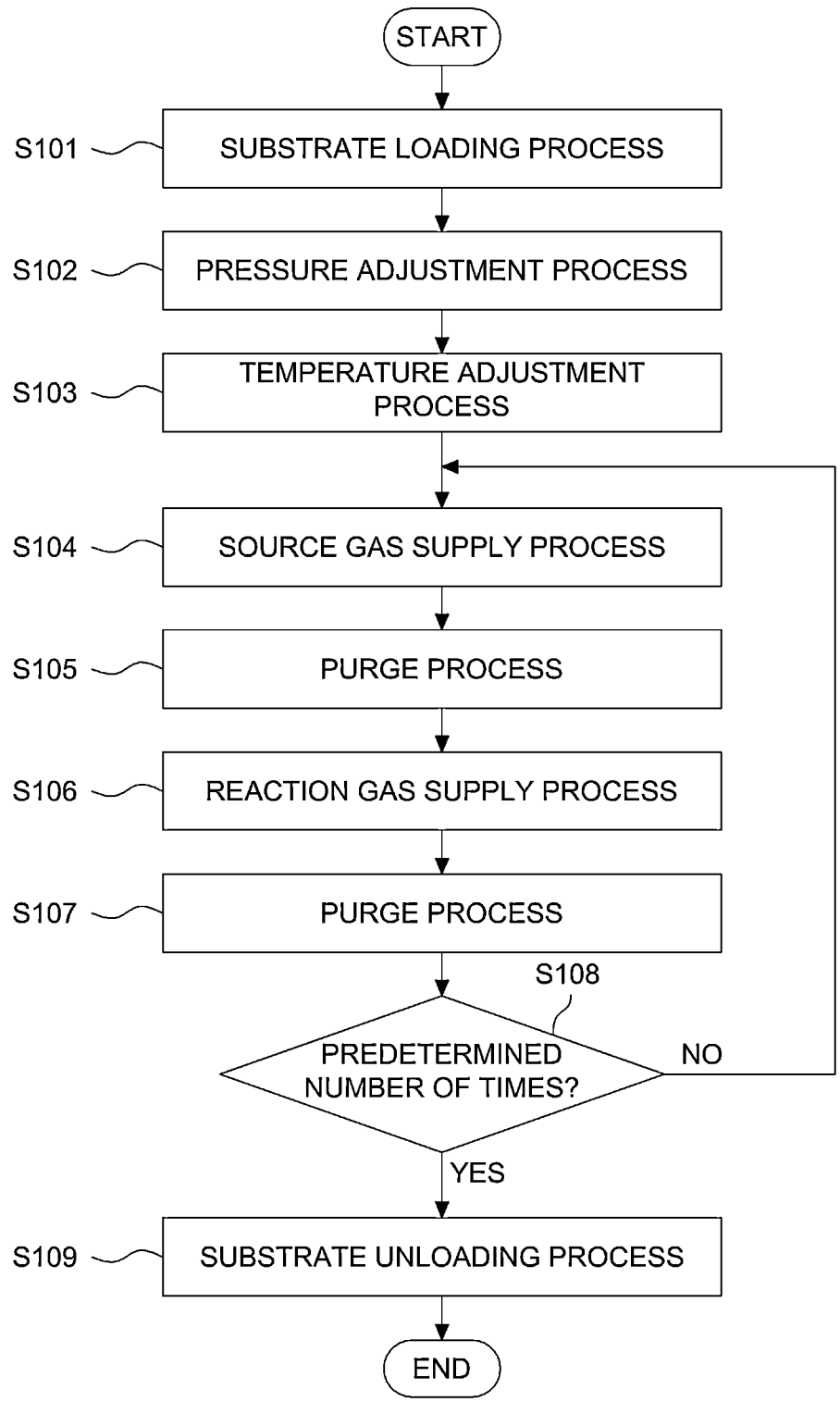
FIG. 4 is a flowchart illustrating a film-forming sequence according to the first embodiment of the present invention.

First, when a plurality of wafers 200 are loaded (wafer charging) on the boat 217 [refer to step (S101) in FIG. 4], as illustrated in FIG. 1, the boat 217 supporting the plurality of wafers 200 is lifted by the boat elevator 115 to be loaded into the process chamber 201 (boat loading) [refer to step (S102) in FIG. 4]. In this state, the seal cap 219 seals the lower end of the manifold 209.

Pressure Adjusting Process (S102)

An inside of the process chamber 201 is vacuum-exhausted to a desired pressure (degree of vacuum) by the vacuum pump 231c. At this time, the pressure in the process chamber 201 is measured by the pressure sensor 245, and the valve 243 is feedback-controlled (pressure adjustment) based on information on the measured pressure (refer to step (S102) in FIG. 4).

Temperature Adjustment Process (S103)

Also, the inside of the process chamber 201 is heated to a desired temperature by the heater 207. At this time, based on information on the temperature detected by the temperature sensor 269, power supply to the heater 14 is feedback-controlled (temperature adjustment) such that the inside of the process chamber 201 has a desired temperature distribution [refer to step (S103) in FIG. 4]. Subsequently, the wafer 200 is rotated due to rotation of the boat 217 by the rotating mechanism 267.

Also, the vacuum pump 246 is continuously operated while at least processing on the wafer 200 is completed. In addition, the inside of the process chamber 201 is heated to a desired temperature by the heater 207. At this time, based on information on the temperature detected by the temperature sensor 269, power supply to the heater 14 is feedback-controlled (temperature adjustment) such that the inside of the process chamber 201 has a desired temperature distribution. Also, heating the inside of the process chamber 201 by the heater 207 is continuously preformed while at least processing on the wafer 200 is completed. Subsequently, the rotating mechanism 267 starts to rotate the boat 217 and the wafer 200. Also, the rotating mechanism 267 continuously rotates the boat 217 and the wafer 200 while at least processing on the wafer 24 is completed.

TiN Film Forming Process

Step (S104)

In step (S104) (refer to FIGS. 4 and 5, first process, transition metal source supply process, and $TiCl_4$ supply process), the $TiCl_4$ gas flows first. The valve 314 of the gas supply pipe 310 is opened and $TiCl_4$ gas flows into the gas supply pipe 310 from the bubbler (not illustrated) serving as a vaporizing unit. The $TiCl_4$ gas flowing into the gas supply pipe 310 is generated such that $N_2$ gas is supplied from the MFC 312 to the bubbler and the bubbler bubbles $TiCl_4$. A flow rate of the $TiCl_4$ gas supplied into the gas supply pipe 310 is adjusted by either or both of a flow rate of the MFC 312 and a temperature of the bubbler. Also, a $TiCl_4$ liquid having a flow rate adjusted by a liquid MFC (not illustrated) is supplied in the bubbler for each substrate processing process. The $TiCl_4$ gas having the adjusted flow rate is supplied from the gas supply pipe 310 to the wafer 200 in the process chamber 201 through the nozzle 420 and is exhausted from the exhaust pipe 231. At the same time, the valve 514 is opened and an inert gas such as $N_2$ gas flows into the carrier gas supply pipe 510. The MFC 512 adjusts a flow rate of the $N_2$ gas flowing into the carrier gas supply pipe 510. The $N_2$ gas having the adjusted flow rate is supplied into the process chamber 201 together with the $TiCl_4$ gas and is exhausted from the exhaust pipe 231.

In this case, in order to address the above problem, from at least a second cycle, supply of the $TiCl_4$ gas into the process chamber 201 is performed intermittently (discontinuously). In other words, supply of the source gas is divided in a plurality of steps and performed. A step of gas supply t1 is performed a plurality of times, and gas stop t2 is performed between the gas supply steps t1. In other words, while the source gas is supplied, the gas stop t2 of temporarily stopping (suspending) supply of the source gas is performed. Also, in other words, supply of the reaction gas is intermittently performed. In addition, between the gas stop steps t2, either or both of vacuum exhaust and purge may be performed. By performing the gas supply t1 and the gas stop t2 in this manner, it is possible to remove by-products generated in the gas supply t1 during the gas stop t2. The by-products interfere physically or chemically with a reaction (main reaction) of the source gas and the reaction gas, thereby reducing a probability of main reaction occurrence. Interference with the main reaction is generated when a partial pressure of the source gas or the reaction gas decreases due to an increased partial pressure of the by-products or when the by-products are adhered to an adsorption site. The main by-products may include hydrogen chloride (HCl). Chemical interference is generated when ammonium chloride ($NH_4Cl$) is formed by a secondary reaction of hydrogen chloride and ammonia, and thereby the partial pressure of the source gas or the reaction gas decreases.

At this time, by appropriately adjusting the valve 243, the pressure in the process chamber 201 is set to, for example, a range of 10 Pa to 1,330 Pa. The valve 243 is basically opened at all times and a gas concentration decreases due to it being opened at all times. When a predetermined amount of exposure to the wafer 200 needs to be obtained within a predetermined time, since the number of times the $TiCl_4$ gas is supplied needs to be increased, there is a trade-off. A supply flow rate of the $TiCl_4$ gas is set to have a flow rate of, for example, a range of 10 ccm to 1,000 ccm. A time for which the wafer 200 is exposed to the $TiCl_4$ gas, that is, a time of the gas supply t1 [radiation time] is set to, for example, a range of 0.01 seconds to 300 seconds, and preferably a range of 0.01 seconds to 5 seconds. A time for the gas stop t2 is a time that is sufficient to exhaust the $TiCl_4$ gas from the inside of the process chamber 201, and is set to, for example, a range of 0.01 seconds to 300 seconds, and preferably a range of 0.01 seconds to 30 seconds. In this case, the temperature of the heater 207 is set such that the temperature of the wafer 200 falls within, for example, a range of 100° C. to 400° C., and preferably a range of 200° C. to 400° C. According to the supply of the $TiCl_4$ gas, a Ti-containing layer is formed on the wafer 200.

Intermittent supply of the source gas is performed from at least the second cycle. As illustrated in FIG. 5, before a first cycle of source gas supply, since the reaction gas is not supplied, by-products may not be generated. When there are no by-products in this way, the first cycle may be performed without division indicated by a dashed line.

Also, in step (S104), the valve 524 is opened to flow an inert gas such as $N_2$ gas from the gas supply pipe 320. During the gas stop t2, the inert gas may also be supplied. In this way, it is possible to prevent the $TiCl_4$ gas from flowing back into the nozzle 420.

Step (S105)

In step (S105) (refer to FIGS. 4 and 5, second process and purge process), the valve 314 is closed to suspend supply of the $TiCl_4$ gas into the process chamber 201. At this time, while the APC valve 243 is opened, the inside of the process chamber 201 is vacuum-exhausted by the vacuum pump 246, and thereby an unreacted gas remaining in the process chamber 201 or $TiCl_4$ gas that has contributed to formation of the Ti-containing layer is removed from the inside of the process chamber 201.

Also, at this time, while the valves 514 and 524 remain open or are newly opened, supply of the $N_2$ gas as the inert gas into the process chamber 201 is maintained or begins. The $N_2$ gas serves as a purge gas. Accordingly, an unreacted gas remaining in the process chamber 201 or $TiCl_4$ gas that has contributed to formation of the Ti-containing layer is further removed from the inside of the process chamber 201. The purge is performed by supplying the $N_2$ gas in a flow rate of, for example, 500 ccm to 50,000 ccm, and for a time, for example, 1 seconds to 90 seconds.

Also, at this time, the remaining gas in the process chamber 201 may not be completely removed and the inside of the process chamber 201 may not be completely purged. When an amount of the remaining gas in the process chamber 201 is small, there is no negative influence in step (S106) performed thereafter. In this case, there is no need to set a flow rate of the $N_2$ gas supplied into the process chamber 201 to be high. For example, when the same amount of the $N_2$ gas as a volume of the process container 203 [the process chamber 201] is supplied, it is possible to purge to the extent that there is no negative influence in step (S106). When the inside of the process chamber 201 is not completely purged in this way, it is possible to reduce a purge time, thereby improving the throughput. Also, it is possible to suppress unnecessary consumption of the $N_2$ gas to the minimum.

Step (S106)

In step (S106) (refer to FIGS. 4 and 5, third process, reaction gas supply process, and $NH_3$ supply process), $NH_3$ gas flows first. The valve 324 of the gas supply pipe 320 is opened to flow the $NH_3$ gas into the gas supply pipe 320. The MFC 322 adjusts a flow rate of the $NH_3$ gas flowing into the gas supply pipe 320. The $NH_3$ gas having the adjusted flow rate is supplied from the gas supply pipe 320 to the wafer 200 in the process chamber 201 through the nozzle 420 and is exhausted from the exhaust pipe 231.

At this time, in order to address the above problem, the $NH_3$ is intermittently (discontinuously) supplied. In other words, supply of the reaction gas is divided and performed in a plurality of steps. A step of gas supply t3 is performed a plurality of times, and gas stop t4 is performed between the gas supply steps t3. In other words, while the reaction gas is supplied, the gas stop t4 of temporarily stopping (suspending) supply of the reaction gas is performed. Also, in other words, supply of the reaction gas is intermittently performed. In addition, between the gas stop steps t4, either or both of vacuum exhaust and purge may be performed. By performing the gas supply t3 and the gas stop t4 in this manner, it is possible to remove by-products generated in the gas supply t3 during the gas stop t4.

At this time, by appropriately adjusting the valve 243, the pressure in the process chamber 201 is set to, for example, a range of 10 Pa to 1,330 Pa. The valve 243 is basically opened at all times and a gas concentration decreases due to it being opened at all times. When a predetermined amount of exposure to the wafer 200 needs to be obtained within a predetermined time, since the number of times the $NH_3$ gas is supplied needs to be increased, there is a trade-off. A supply flow rate of the $NH_3$ gas controlled by the MFC 322 is set to have a flow rate of, for example, a range of 10 ccm to 15,000 ccm, preferably a range of 500 ccm to 15,000 ccm, and more preferably a range of 1,000 ccm to 13,500 cm. A time for which the wafer 200 is exposed to the $NH_3$ gas, that is, a time of the gas supply t3 (radiation time), is set to, for example, a range of 0.01 seconds to 600 seconds, and preferably a range of 0.01 seconds to 5 seconds. A time for the gas stop t4 is a time that is sufficient to exhaust the $NH_3$ gas from the inside of the process chamber 201, and is set to, for example, a range of 0.01 seconds to 600 seconds, and preferably a range of 0.01 seconds to 30 seconds. Also, when the reaction gas is supplied, a layer containing titanium (Ti) and chlorine (Cl) on a surface of the substrate and many more by-products than in step (S104) may be considered to be generated. The by-products may include hydrogen chloride (HCl) and ammonium chloride ($NH_4Cl$). When a generation amount of the by-products is large, it is preferable that a time of the gas supply t3 be shorter than a time of the gas supply t1. Also, a time of the gas supply t4 may be longer than a time of the gas supply t2. Also, when a time of the gas supply t3 is set to be small, a time of step (S106) may be extended. At this time, the temperature of the heater 207 is set such that the temperature of the wafer 200 falls within, for example, a range of 100° C. to 400° C., and preferably a range of 200° C. to 400° C. According to the supply of the $NH_3$ gas, a nitrogen-containing layer is formed on the wafer 200.

Also, in step (S106), the valve 514 is opened to flow an inert gas such as $N_2$ gas from the gas supply pipe 320. During the gas stop t4, the inert gas may also be supplied. When the inert gas is supplied in this way, it is possible to prevent the $NH_3$ gas from flowing back into the nozzle 410.

Step (S107)

In step (S107) (refer to FIGS. 4 and 5, fourth process, and purge process), the valve 324 is closed to suspend supply of the $NH_3$ gas into the process chamber 201. At this time, while the valve 243 is opened, the inside of the process chamber 201 is vacuum-exhausted by the vacuum pump 246, and thereby an unreacted gas remaining in the process chamber 201 or $NH_3$ gas that has contributed to formation of the nitrogen-containing layer is removed from the inside of the process chamber 201.

Also, at this time, while the valves 514 and 524 remain opened or are newly opened, supply of the $N_2$ gas as the inert gas into the process chamber 201 is maintained or begins. The $N_2$ gas serves as a purge gas. Accordingly, an unreacted gas remaining in the process chamber 201 or $NH_3$ gas that has contributed to formation of the nitrogen-containing layer is further removed from the inside of the process chamber 201. The purge is performed by supplying the $N_2$ gas in a flow rate of, for example, 500 ccm to 50,000 ccm, and for a time of, for example, 1 seconds to 90 seconds.

Also, at this time, the remaining gas in the process chamber 201 may not be completely removed and the inside of the process chamber 201 may not be completely purged. When an amount of the remaining gas in the process chamber 201 is small, there is no negative influence in steps performed thereafter. In this case, when the same amount of the $N_2$ gas as a volume of the process container 203 [the process chamber 201] is supplied, it is possible to purge to the extent that there is no negative influence in a subsequent step. When the inside of the process chamber 201 is not completely purged in this way, it is possible to reduce a purge time, thereby improving the throughput. Also, it is possible to suppress unnecessary consumption of the $N_2$ gas to the minimum.

Step (S108)

When the above steps (S104 to S107) are set as a cycle and the cycle is performed at least once [step (S108)], it is possible to form a conductive film having a predetermined film thickness and containing titanium and nitrogen, that is, a TiN film, on the wafer 200. Also, it is preferable that the above cycle be repeated a plurality of times. Accordingly, a TiN film having a predetermined film thickness is formed on the wafer 200. Also, in the above description, the process is performed in order of step (S104), step (S105), step (S106), and step (S107). However, step (S104) and step (S106) may be reversed, and the process may start from step (S105) or step (S106).

Figure 5:
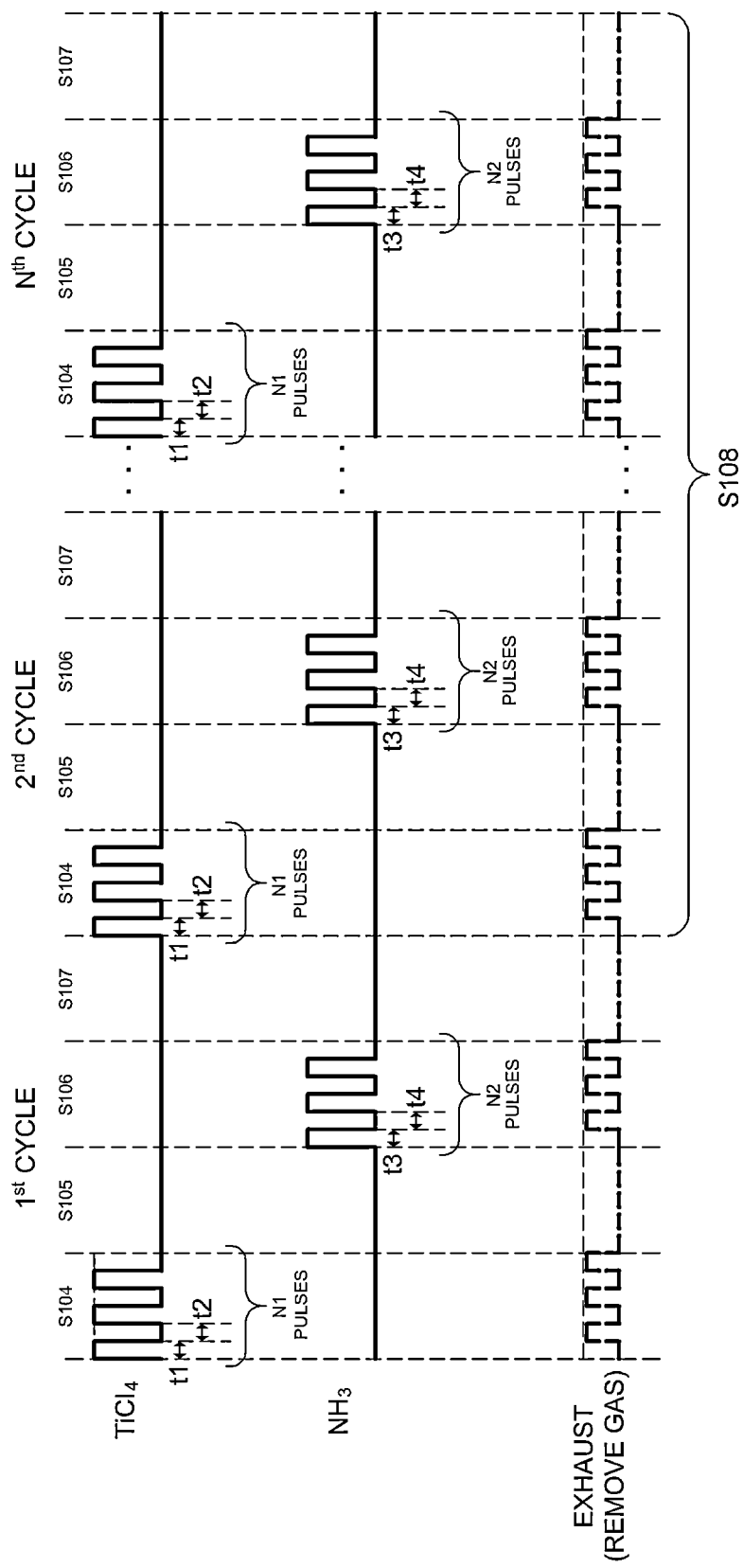
FIG. 5 is a gas supply timing chart illustrating the film-forming sequence according to the first embodiment of the present invention.

Also, as illustrated in FIG. 5, in step (S104), step (S105), step (S106), and step (S107), the degree of opening of the valve 243 may be constantly maintained. However, in step (S104), by increasing the degree of opening of the valve at the gas stop t2, an exhaust amount may be increased. At the gas stop t4 in step (S106), by increasing the degree of opening of the valve, an exhaust amount may also be increased. Also, in the purge process [step (S105) or step (S107)], the degree of opening of the valve may be increased. Accordingly, it is possible to improve efficiency of removal of the by-products.

After the TiN film is formed, the valves 512 and 522 of the gas supply pipes 310 and 320 are opened to flow the $N_2$ gas into the process chamber 201. The $N_2$ gas serves as a purge gas. Accordingly, the inside of the process chamber 201 is purged with the inert gas, and thereby the remaining gas in the process chamber 201 is removed from the inside of the process chamber 201. Then, an atmosphere in the process chamber 201 is replaced with the inert gas and the inside of the process chamber 201 is adjusted to a predetermined pressure.

Substrate Unloading Process
Step (S109)

After the inside of the process chamber 201 is adjusted to a predetermined pressure, a valve 534 is closed, and the boat 217 is unloaded from the process chamber 201 by the boat elevator 115 (boat unloading). Then, the wafer 200 is discharged from the boat 217.

According to the process described above, the conductive film is formed on the substrate.

Figure 6:
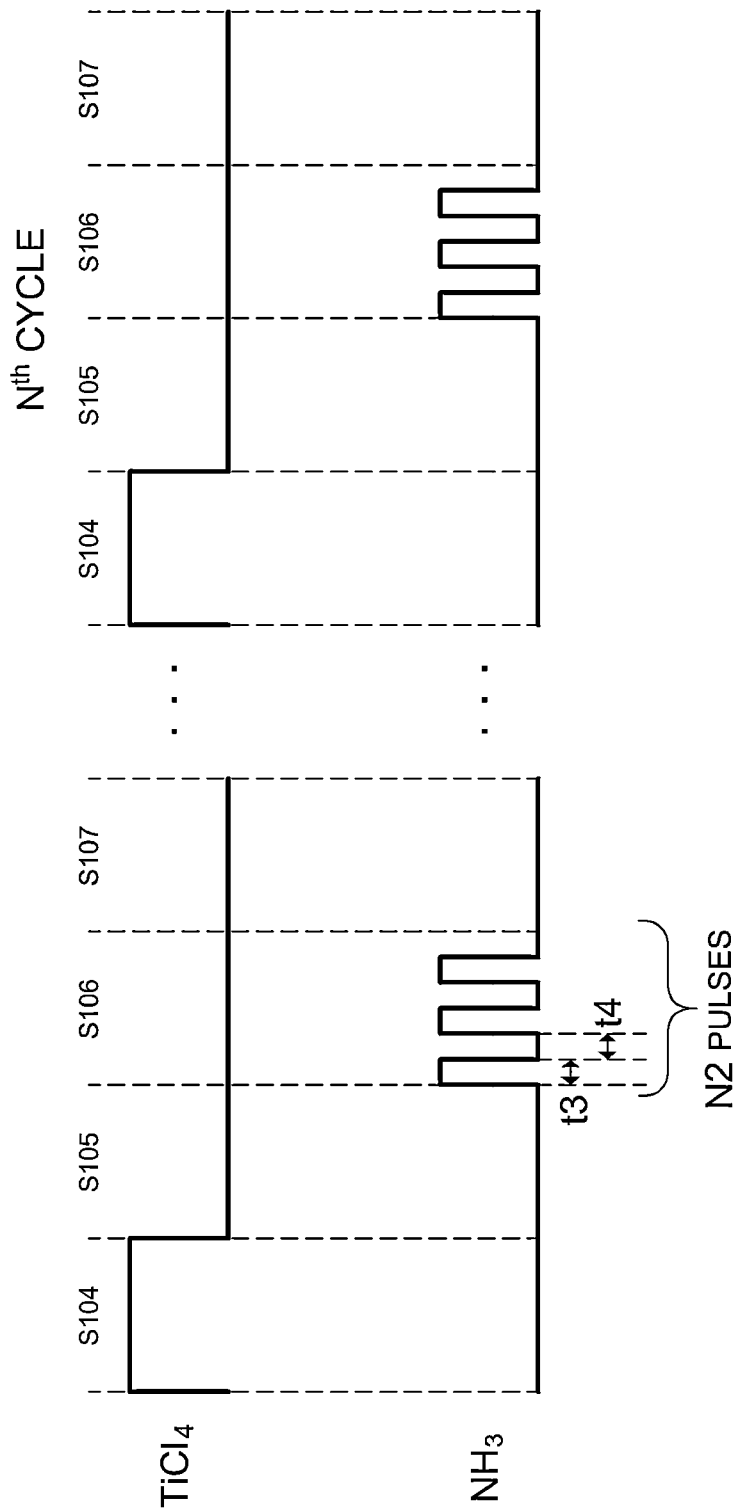
FIG. 6 is a diagram illustrating a first mode of the gas supply timing chart for describing the film-forming sequence according to the first embodiment of the present invention.
Figure 7:
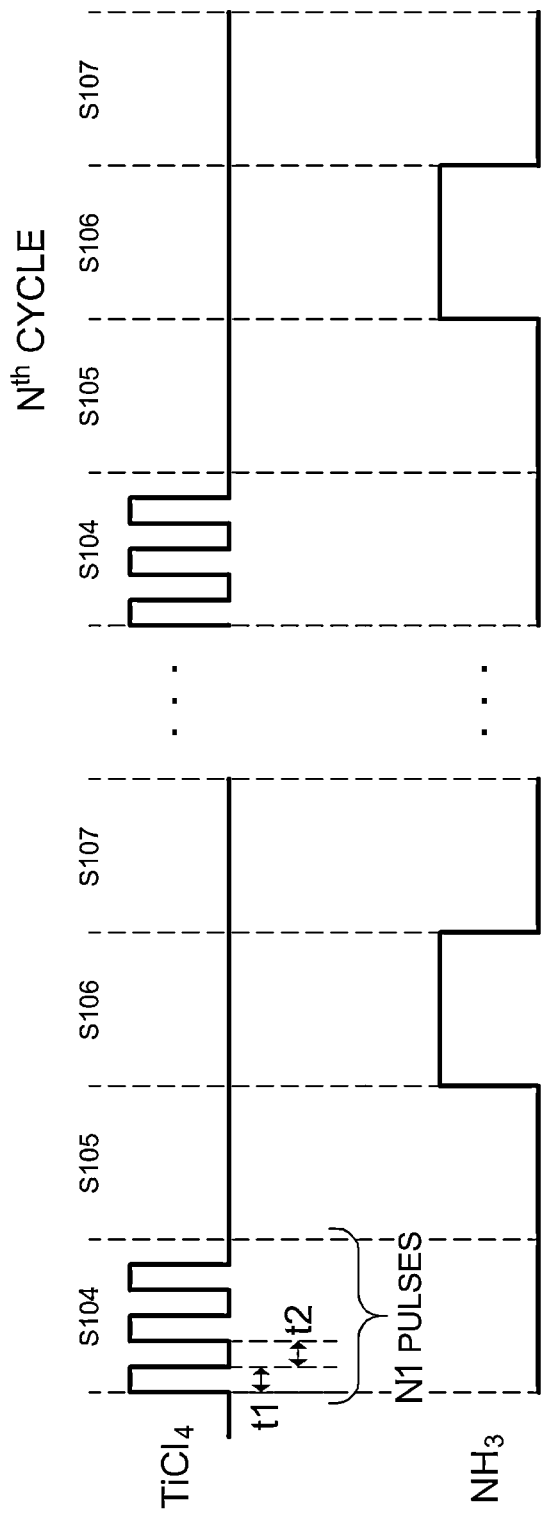
FIG. 7 is a diagram illustrating a second mode of the gas supply timing chart for describing the film-forming sequence according to the first embodiment of the present invention.
Figure 8:
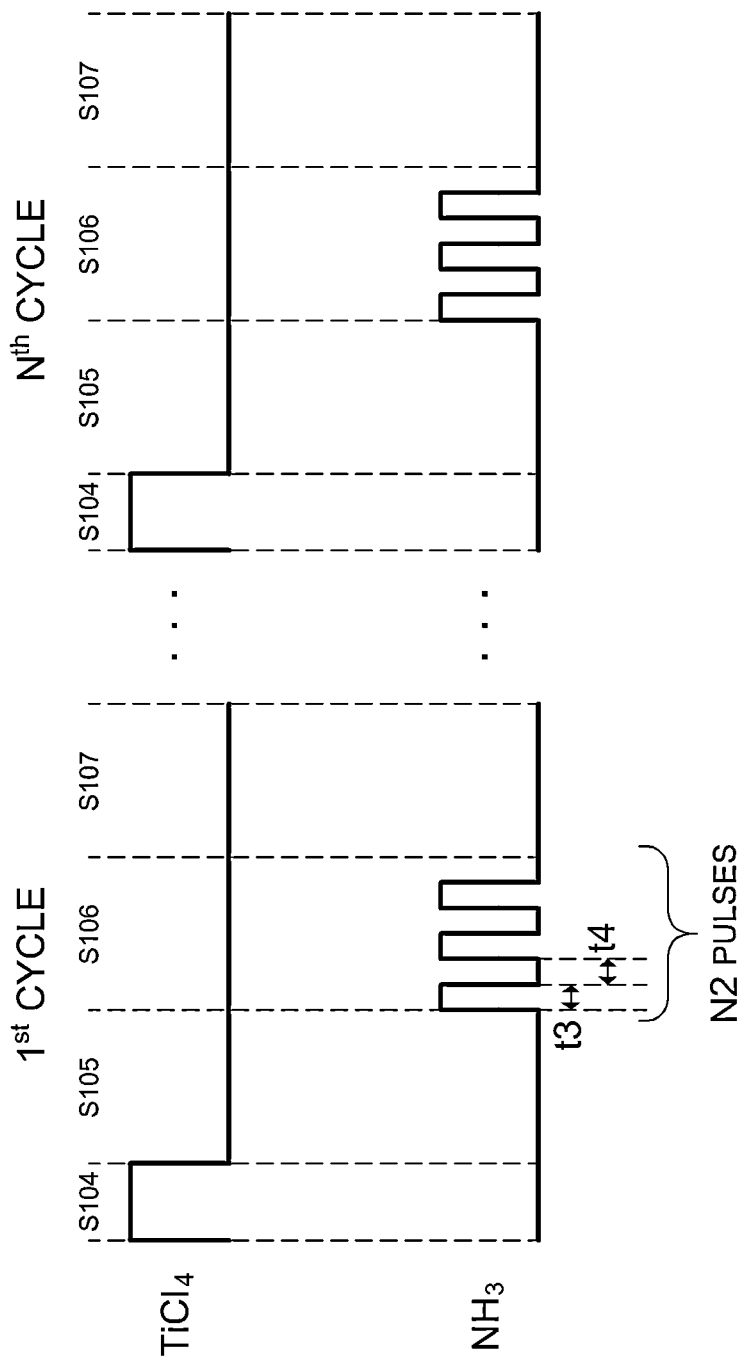
FIG. 8 is a diagram illustrating a third mode of the gas supply timing chart for describing the film-forming sequence according to the first embodiment of the present invention.

Also, in the embodiment described above, while both the source gas and the reaction gas are supplied in temporally separated pulses, the present invention is not limited thereto. As illustrated in FIGS. 6 and 7, for example, either the source gas or the reaction gas may be supplied in temporally separated pulses. Also, when the gas is continuously supplied rather than supplied in temporally separated pulses, a time of a continuous supply step may be shorter than a time of an intermittent supply step as illustrated in FIG. 8.

Figure 9:
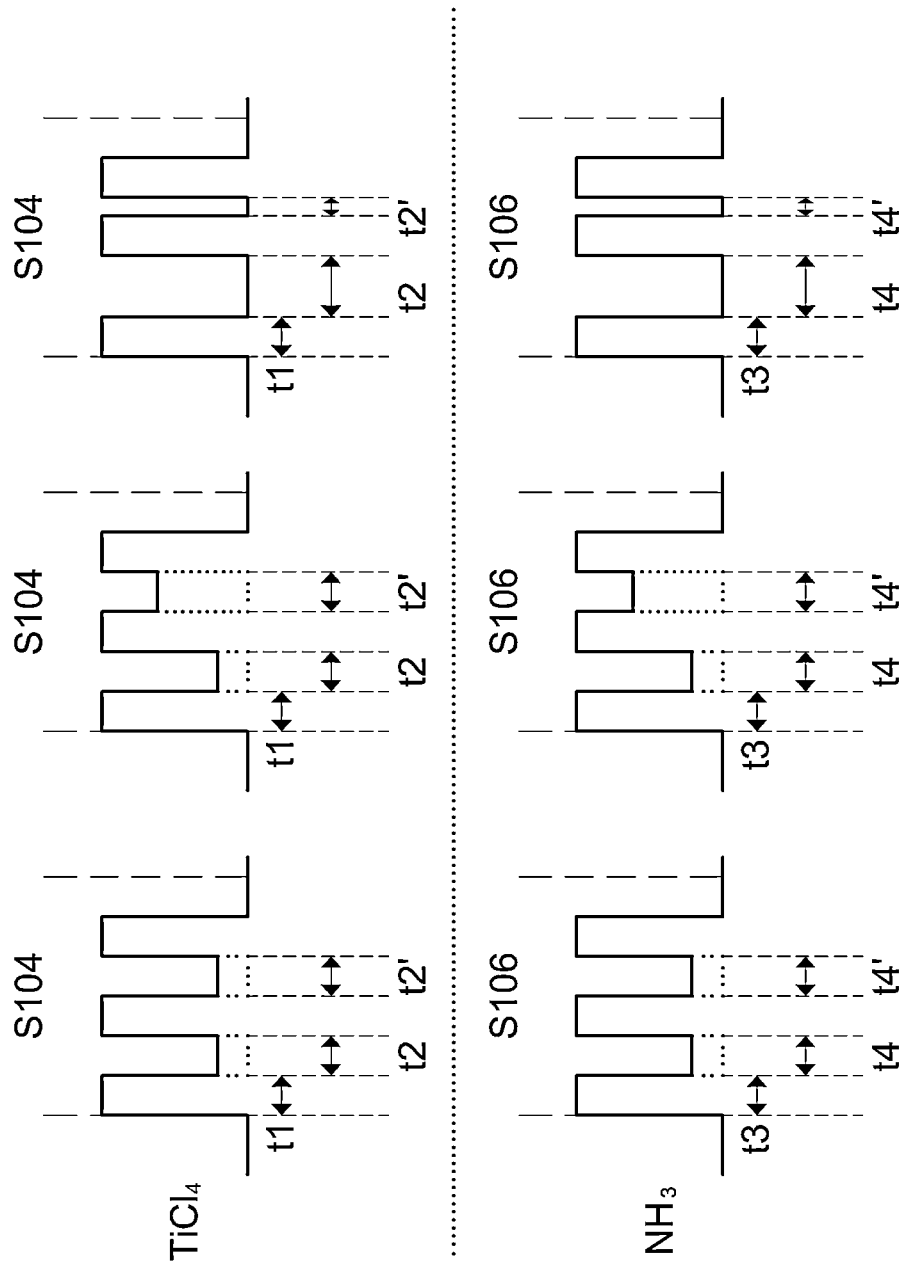
FIG. 9 is a diagram illustrating other mode of a gas supply timing in the film-forming sequence according to the first embodiment of the present invention.

Also, while supply of the source gas stops in the above description, the present invention is not limited thereto. For example, it may be configured such that, when a generation amount of the by-products is small, as illustrated in FIG. 9, supply of the source gas is not completely stopped at the gas stop t2 of the source gas, and the flow rate of the source gas is reduced. Also, during step (S104), when the gas stop t2 is performed a plurality of times, the flow rate of the source gas is reduced at the initial gas stop t2, and the flow rate of the source gas at the next gas stop t2' may be higher than that of the initial gas stop t2. Also, a time of the initial gas stop may be set to be longer, and a time of the next gas stop t2' may be set to be shorter. In such a configuration, it is possible to improve the manufacturing throughput of the semiconductor device.

Also, while supply of the reaction gas stops in the above description, the present invention is not limited thereto. For example, it may be configured such that, when a generation amount of the by-products is small, as illustrated in FIG. 9, supply of the reaction gas is not completely stopped at the gas stop t4 of the reaction gas, and the flow rate of the reaction gas is reduced. Also, during step (S106), when the gas stop t4 is performed a plurality of times, the flow rate of the reaction gas is reduced at the initial gas stop t4, and the flow rate of the reaction gas at the next gas stop t4' may be higher than that of the initial gas stop t4. Also, a time of the initial gas stop t4 may be set to be longer and a time of the next gas stop t4' may be set to be shorter. In such a configuration, it is possible to improve the manufacturing throughput of the semiconductor device.

Figure 10:
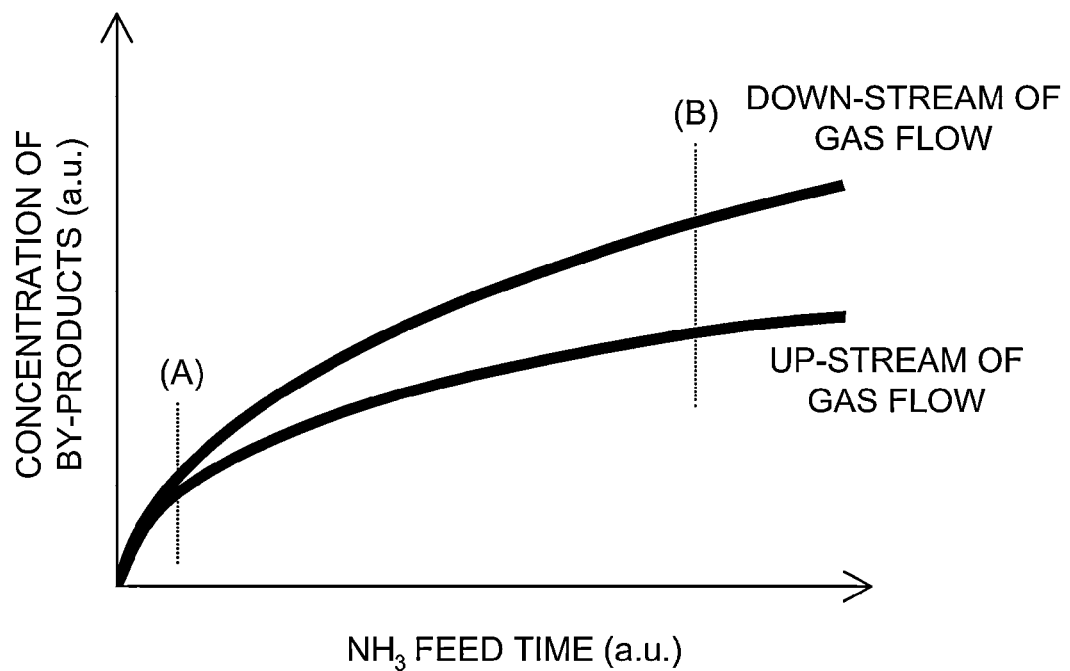
FIG. 10 is a diagram illustrating a relation between a supply time of $NH_3$ gas and a concentration of by-products on a wafer.

FIG. 10 illustrates a relation between a supply time of the $NH_3$ gas as the reaction gas and a concentration of by-products on the wafer. When a supply time of the $NH_3$ gas is (A), there is no difference between concentrations of the by-products in an upstream side of a gas flow (up-stream of gas flow) and a downstream side of a gas flow (down-stream of gas flow). However, when a supply time of the $NH_3$ gas is (B), it is observed that the downstream side has a significantly higher concentration of by-products than the upstream side. When the $TiCl_4$ gas is used as the source gas, the same tendency may be considered to be shown. Therefore, between the wafers such as (A), it is preferable that a gas supply period in which a concentration distribution of by-products is substantially the same be set as gas supply t1 and t3. That is, preferably, the gas supply period is appropriately controlled such that the by-products have substantially the same concentration distribution between the wafers according to a kind of the source gas and/or the reaction gas, and thereby intermittent supply is performed.

Figure 11:
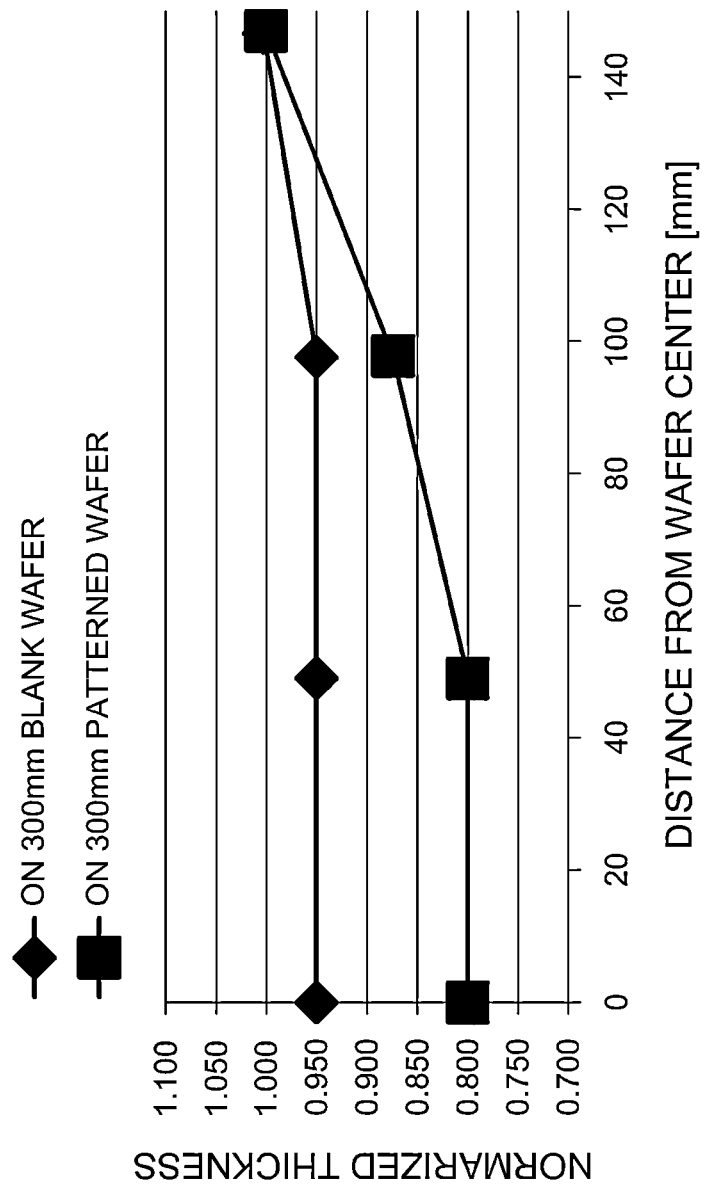
FIG. 11 is a diagram illustrating a relation between a film thickness and a distance from a wafer center when $TiCl_4$ gas and $NH_3$ gas are continuously supplied to form a film.

Also, FIG. 11 illustrates a relation between a film thickness and a distance from a wafer center when the $TiCl_4$ gas and the $NH_3$ gas are continuously supplied to form a film. A relation between a flat wafer (300 mm blank wafer) having no pattern on a wafer and a pattern wafer (300 mm patterned wafer) having a pattern on a wafer is compared. In FIG. 11, it can be observed that, while there is almost no difference in a film thickness of the flat wafer, a film thickness gradually becomes thinner in the pattern wafer toward a wafer center portion from a wafer outer edge. This is considered to be due the fact that by-products interfere with film-forming in the pattern wafer and displacement efficiency decreases in the wafer center portion.

Figure 12:
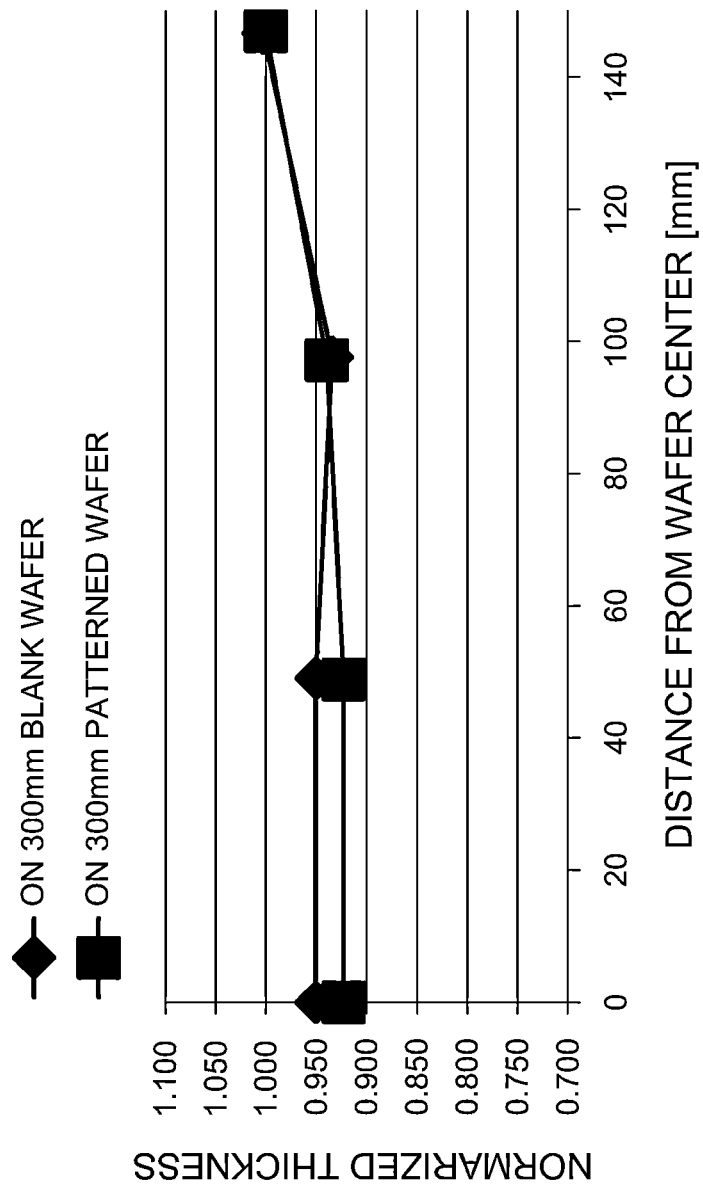
FIG. 12 is a diagram illustrating a relation between a film thickness and a distance from a wafer center when the $TiCl_4$ gas is continuously supplied and the $NH_3$ gas is supplied in temporally separated pulses to form a film.

On the other hand, FIG. 12 illustrates a relation between a film thickness and a distance from a wafer center when the $TiCl_4$ gas is continuously supplied and the $NH_3$ gas is supplied in temporally separated pulses to form a film. In FIG. 12, it is observed that film thickness uniformity improves from a wafer outer edge to a wafer center portion in the pattern wafer, which is substantially the same as in the flat wafer. This tendency may also be considered to be shown when the $TiCl_4$ gas is used as the source gas. In addition, when the reaction gas such as the $NH_3$ gas is supplied, since there is a layer containing an element included in the source gas, such as titanium (Ti), chlorine (Cl), and the like, on a surface of the substrate, many by-products may be generated. Accordingly, the present invention is more effective when the reaction gas is used than when the source gas is used. The effect of the present invention can be considered to be obtained even when only the reaction gas is supplied in temporally separated pulses and the source gas is continuously supplied.

Figure 13:
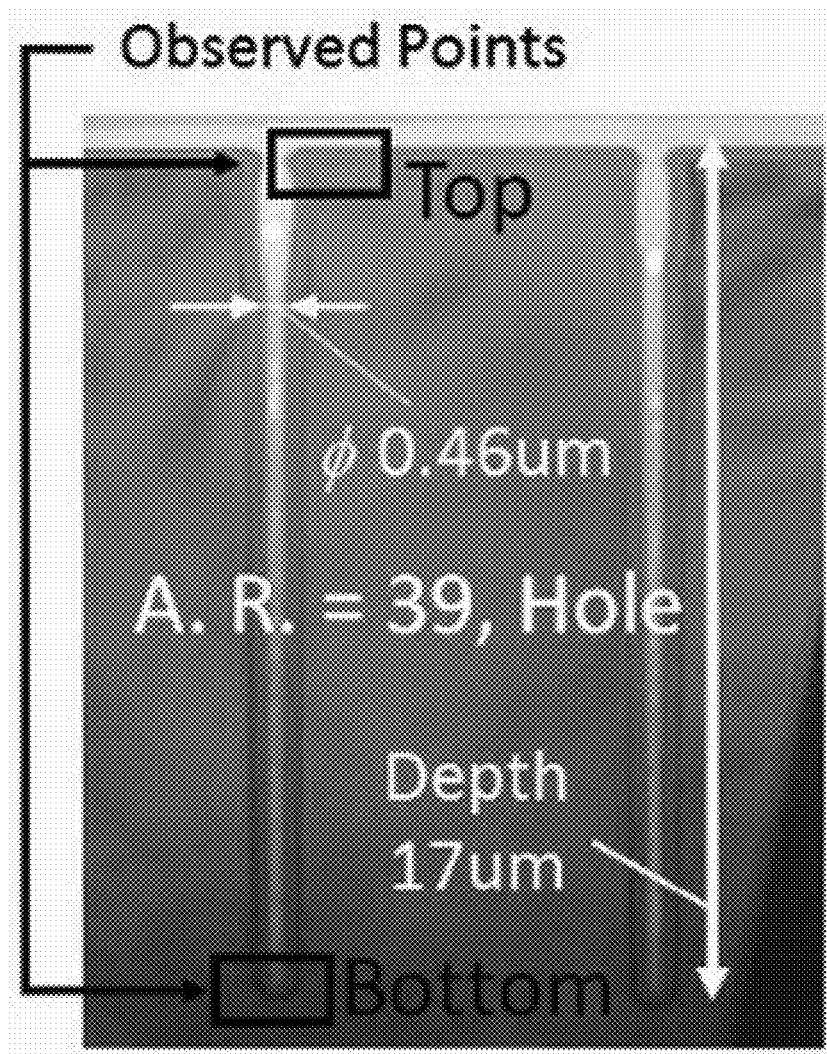
FIG. 13 is a diagram illustrating an exemplary hole pattern on the wafer.
Figure 14:
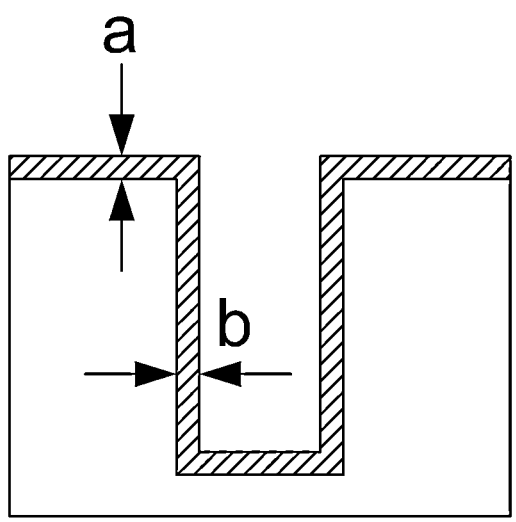
FIG. 14 is a diagram referred to when step coverage is calculated in the hole pattern illustrated in FIG. 13.

Also, FIGS. 13, 14, and 15 illustrate comparison of step coverage in a hole pattern when the $TiCl_4$ gas and the $NH_3$ gas are continuously supplied together (normal flow, continuous flow) and when the $TiCl_4$ gas is continuously supplied and the $NH_3$ gas is supplied in temporally separated pulses to form a film (divided flow). A thickness of a film that is deposited in a top (a) and a bottom (b) is measured and step coverage is calculated by b/a×100(%). As a result, it is observed that the step coverage is 84.5% in the normal flow but the step coverage is improved to 100% in the divided flow. Also, a higher effect than when only the $NH_3$ gas is supplied in temporally separated pulses may be considered to be obtained when the $TiCl_4$ gas is supplied in temporally separated pulses, similar to the $NH_3$ gas.

Second Embodiment

Figure 16:
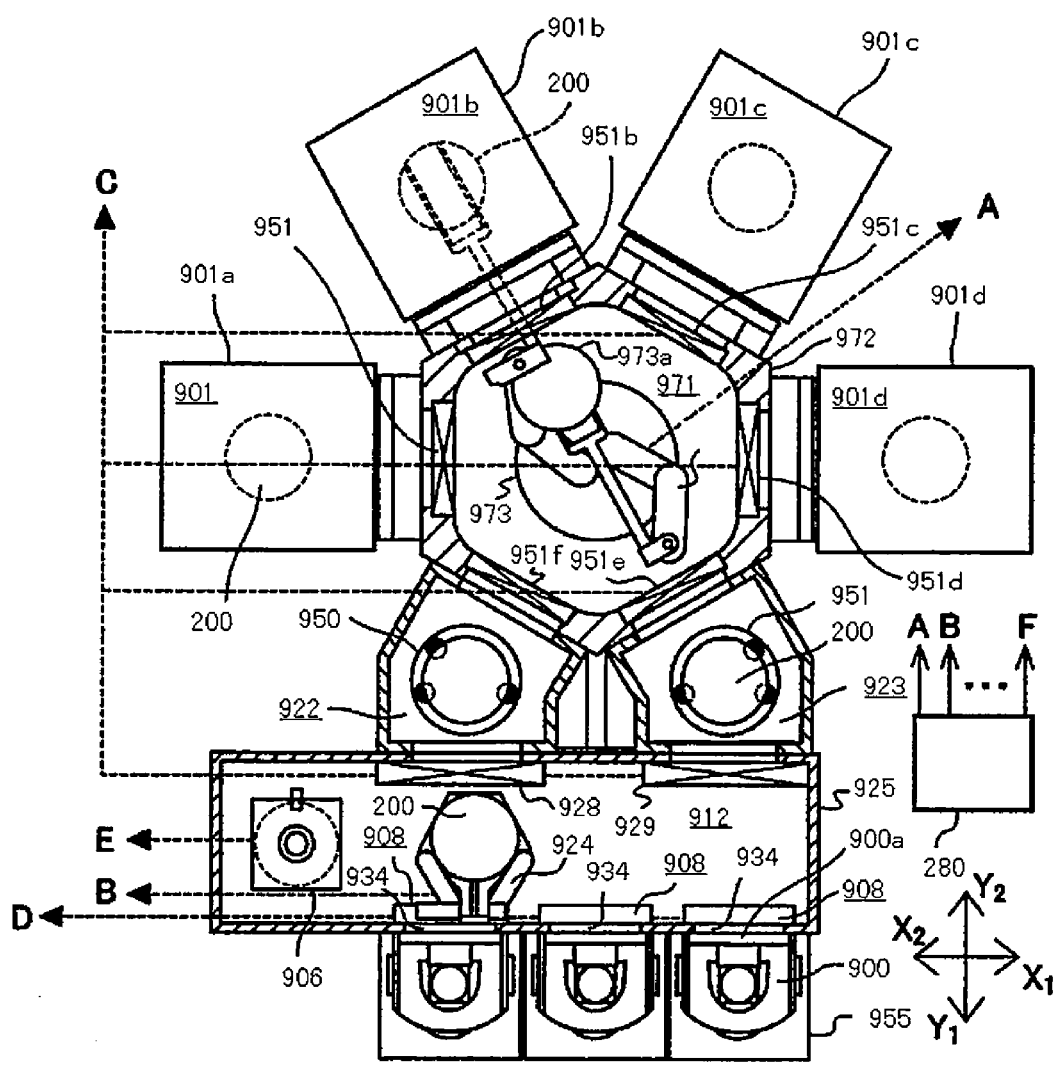
FIG. 16 is a schematic plane cross-sectional view illustrating a substrate processing apparatus preferably used in a second embodiment of the present invention.

Hereinafter, the second embodiment will be described with reference to FIGS. 16, 17, and 18. FIG. 16 is a diagram illustrating a configuration of the substrate processing apparatus according to the present embodiment. While an example in which substrate processing is performed while the wafer 200 is vertically placed in the process container 203 has been described in the above first embodiment, the invention is not limited thereto. As illustrated in FIG. 16, a plurality of process containers 901a, 901b, 901c, and 901d are connected to a transfer container 972, and the process may be performed while one wafer 200 is loaded into each process container. This will be described in detail below.

Transfer Chamber

Figure 17:
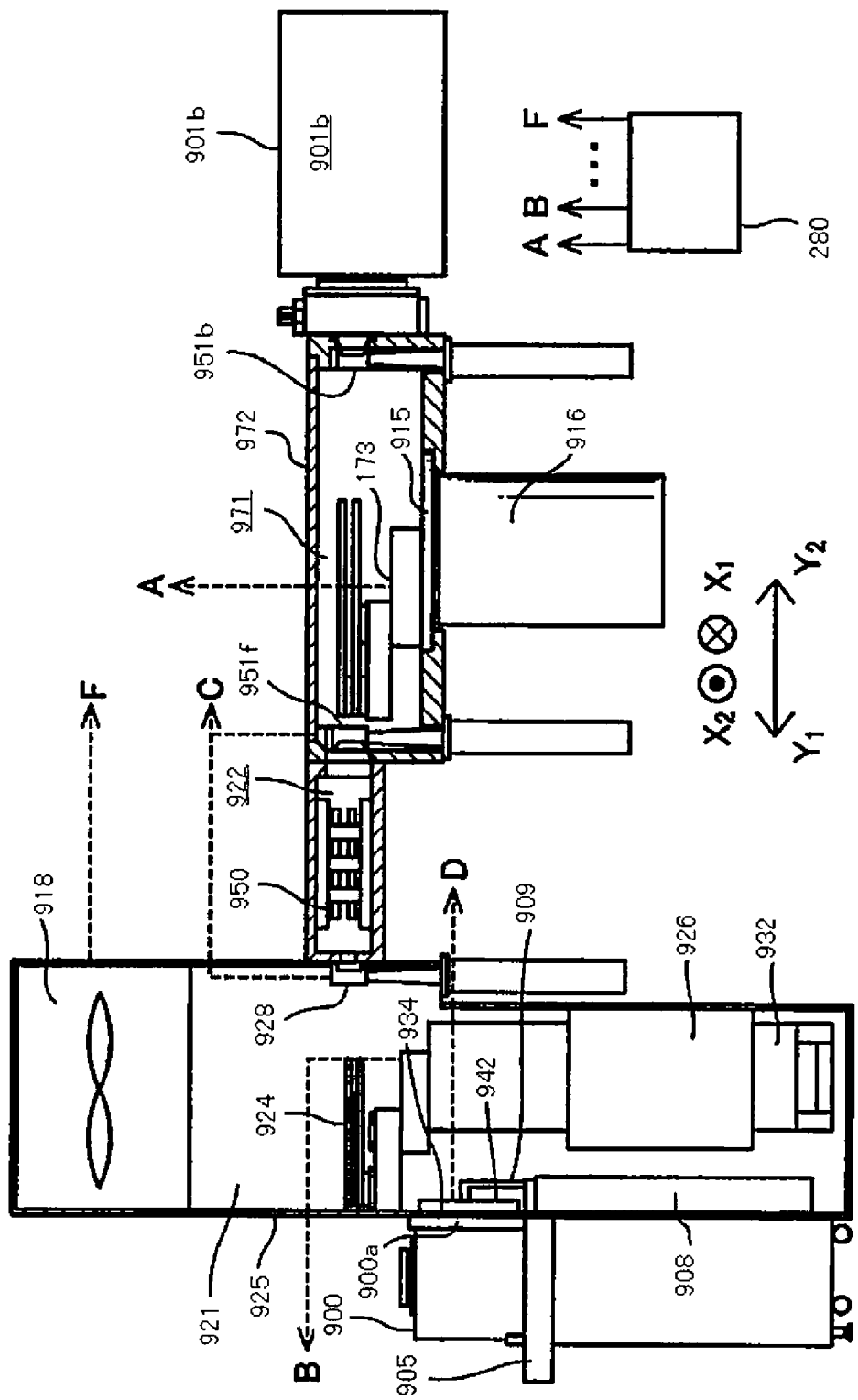
FIG. 17 is a schematic vertical cross-sectional view illustrating the substrate processing apparatus preferably used in the second embodiment of the present invention.

As illustrated in FIGS. 16 and 17, the transfer container 972 is formed in a polygonal shape as seen in a plan view, and is connected to spare chambers 922 and 923, the first process module (PM) 901a, the second PM 901b, the third PM 901c, and the fourth PM 901d, which will be described later, through gate valves 951, 951b, 951c, and 951d. In a center portion of a transfer chamber 971, a transfer robot 973 configured to transmit (transfer) the wafer 200 under negative pressure is installed using a flange 915 as a base. The transfer robot 973 is connected with a robot rotating unit 916 and is rotatably configured.

Spare Chamber

In a wall side to which the PM of the transfer container 972 is not connected, the spare chamber 922 (load-lock module) for loading and the spare chamber 923 for unloading (load-lock module) are connected through the gate valves 951f and 951e, respectively, and each have a structure capable of withstanding a negative pressure.

Also, in the spare chamber 922, a substrate placing table 950 for loading is installed, and in the spare chamber 923, the substrate placing table 951 for unloading is installed. Therefore, it is configured such that the wafer 200 to be loaded or unloaded is held in the spare chamber.

Atmosphere Transfer Chamber and IO Stage

In a front side of the spare chamber 922 and the spare chamber 923, an atmosphere transfer chamber 921 (front end module) is connected through gate valves 928 and 929. The atmosphere transfer chamber 921 is used under atmospheric pressure.

In the atmosphere transfer chamber 921, an atmosphere transfer robot 924 configured to transfer the wafer 200 is installed. As illustrated in FIG. 17, the atmosphere transfer robot 924 is configured to vertically move by an elevator 926 installed in the atmosphere transfer chamber 921, and to reciprocally move in directions X1 and X2 by a linear actuator 932.

As illustrated in FIG. 17, a clean unit 918 configured to supply clean air is installed above the atmosphere transfer chamber 921. Also, as illustrated in FIG. 16, in a direction X2 of the atmosphere transfer chamber 921, a device 906 (hereinafter referred to as a "pre-aligner") for matching a direction of an orientation flat or a notch formed in the wafer 200 is installed.

As illustrated in FIGS. 16 and 17, in a direction Y1 side of a chassis 925 of the atmosphere transfer chamber 921, a pod opener 908 and a substrate loading and unloading port 934 to load or unload the wafer 200 into or from the atmosphere transfer chamber 921 are installed. An IO stage 905 (load port) is installed in a side opposite to the pod opener 908, that is, an outside of the chassis 925 through the substrate loading and unloading port 934.

The pod opener 908 includes a closure 942 configured to open and close a cap 900a of a pod 900 and capable of closing the substrate loading and unloading port 934, and a drive mechanism 909 for driving the closable closure 942. The pod opener 908 opens and closes the cap 900a of the pod 900 placed on the IO stage 905 to open and close a loading and unloading opening of the substrate. Accordingly, the wafer 200 may be loaded or unloaded into or from the pod 900.

Process Module (PM)

Figure 18:
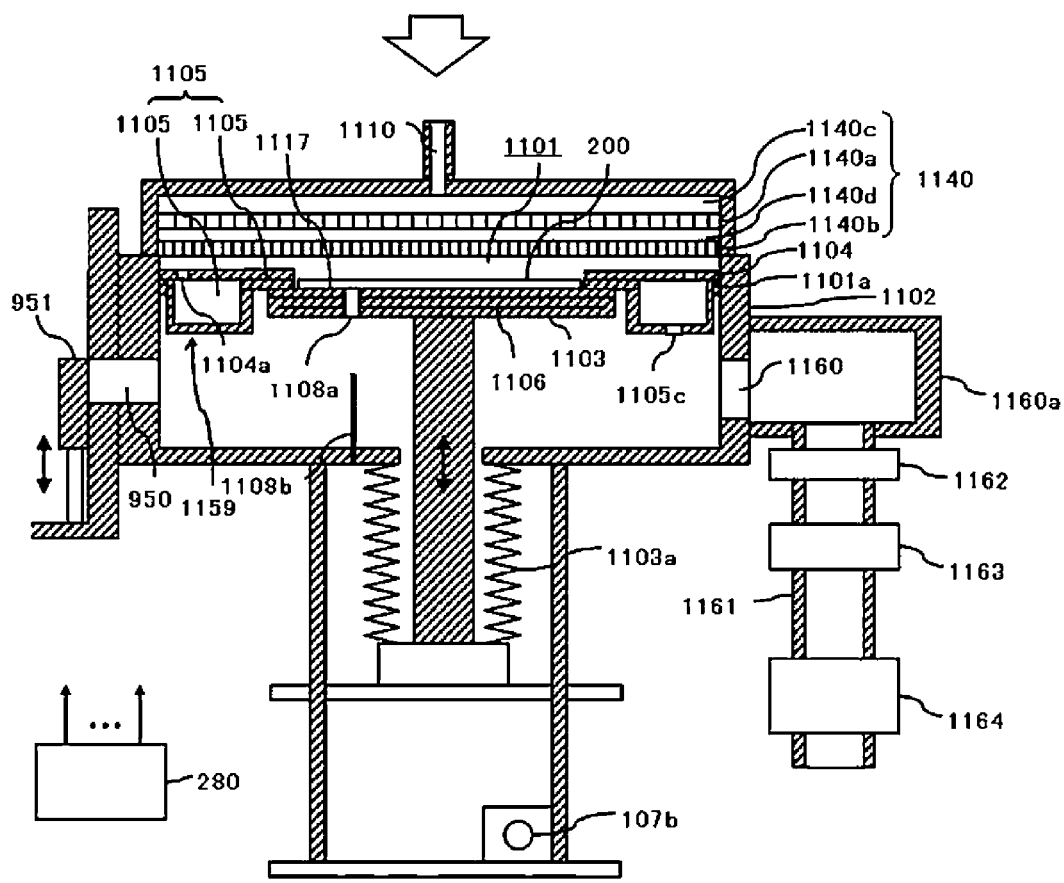
FIG. 18 is a partial vertical cross-sectional view illustrating a process container preferably used in the second embodiment of the present invention.

The process module has a structure as in FIG. 18. The process module includes a process container 1102. The process container 1102 is configured as, for example, a flat airtight container having a circular cross-section. Also, the process container 1102 is made of a metal material such as aluminum (Al) or stainless steel (SUS), or quartz ($SiO_2$). In the process container 1102, a process chamber 1101 is formed to process the wafer 200 such as a silicon wafer as a substrate.

Support Table

A support table 1103 supporting the wafer 200 is installed in the process chamber 1101. The support table 1103 is made of any of, for example, quartz ($SiO_2$), carbon, a ceramic, silicon carbide (SiC), aluminum oxide ($Al_2O_3$), or aluminum nitride (AlN). In a top surface of the support table 1103 with which the wafer 200 directly comes in contact, a susceptor 1117 made of any of, for example, quartz ($SiO_2$), carbon, a ceramic, silicon carbide (SiC), aluminum oxide ($Al_2O_3$), or aluminum nitride (AlN), is installed as a support plate. Also, the support table 1103 may include a heater 1106 serving as a heating unit (heat source) configured to heat the wafer 200 therein. Also, a lower end portion of the support table 1103 penetrates a bottom of the process container 1102, Lifting Mechanism In the outside of the process chamber 1101, a lifting mechanism 1107b configured to raise and lower the support table 1103 is installed. According to raising and lowering of the support table 1103 by operating the lifting mechanism 1107b, the wafer 200 supported on the susceptor 1117 is raised and lowered. When the wafer 200 is transferred, the support table 1103 is lowered to a height of a wafer transfer port 1150 (to be described later), and when the wafer 200 is processed, it is raised to a wafer processing location. Also, the vicinity of a lower end portion of the support table 1103 is covered by a bellows 1103a and the inside of the process chamber 1101 is air-tightly maintained.

Lift Pin

Also, in a bottom (floor surface) of the process chamber 1101, for example, three lift pins 1108b are installed so as to rise in a vertical direction. Also, in the support table 1103 [also including the susceptor 1117], through-holes 1108a through which such lift pins 1108b penetrate are installed in locations corresponding to the lift pins 1108b. Then, when the support table 1103 is lowered to a wafer transfer location, an upper end portion of the lift pin 1108b protrudes from a top surface of the susceptor 1117, and the lift pin 1108b supports the wafer 200 from a lower portion. Also, when the support table 1103 is lifted to the wafer processing location, the lift pin 1108b is buried from the top surface of the susceptor 1117, and the susceptor 1117 supports a wafer 1100 from a lower portion. In addition, since the lift pin 1108b directly comes in contact with the wafer 200, the lift pin 1108b is preferably made of a material such as quartz or alumina.

Wafer Transfer Port

In an inner wall side surface of the process chamber 1101 [the process container 1102], the wafer transfer port 950 configured to transfer the wafer 200 to the inside or the outside of the process chamber 1101 is installed. The gate valve 951 is installed in the wafer transfer port 950. By opening the gate valve 951, the inside of the process chamber 1101 and the inside of the transfer chamber 971 (spare chamber) communicate.

Exhaust System

In an inner wall side surface of the process chamber 1101 [the process container 1102] and a side opposite to the wafer transfer port 950, an exhaust port 1160 configured to exhaust an atmosphere in the process chamber 1101 is installed. In the exhaust port 1160, an exhaust pipe 1161 is connected through an exhaust chamber 1160a. In the exhaust pipe 1161, a pressure regulator 1162 serving as a pressure control device configured to control the inside of the process chamber 1101 to a predetermined pressure such as an auto pressure controller (APC), a source recovery trap 1163, and a vacuum pump 1164 are sequentially connected in series. The exhaust system (exhaust line) mainly includes the exhaust port 1160, the exhaust pipe 1161, and the pressure regulator 1162. The source recovery trap 1163 and the vacuum pump 1164 are installed in a semiconductor manufacturing factory in which the substrate processing apparatus is installed, but may be installed in the substrate processing apparatus.

Gas Inlet

In a top surface [ceiling wall] of a shower head 1140 (to be described later) installed above the process chamber 1101, a gas inlet 1110 configured to supply various gases into the process chamber 1101 is installed. Also, a configuration of a gas supply system connected to the gas inlet 1110 will be described below.

Shower Head

The shower head 1140 is installed between the gas inlet 1110 and the process chamber 1101 as a gas dispersion mechanism. The shower head 1140 includes a shower plate 1140a configured to disperse a gas introduced from the gas inlet 1110, and a shower plate 1140b configured to further uniformly disperse a gas passing through the shower plate 1140a and supply the gas to a surface of the wafer 200 on the support table 1103. In the shower plate 1140a and the shower plate 1140b, a plurality of vent holes are installed. The shower plate 1140a is disposed so as to face a top surface of the shower head 1140 and the shower plate 1140b. The shower plate 1140b is disposed so as to face the wafer 200 on the support table 1103. Also, a space is provided between the top surface of the shower head 1140 and the shower plate 1140a, and between the shower plate 1140a and the shower plate 1140b. Such spaces serve as a first buffer space 1140c (dispersion chamber) configured to disperse a gas supplied from the gas inlet 1110 and a second buffer space 1140d configured to disperse a gas passing through the shower plate 1140a.

Exhaust Duct

In an inner wall side surface of the process chamber 1101 [the process container 1102], a step portion 1101a is installed. The step portion 1101a is configured to maintain a conductance plate 1104 near the wafer processing location. The conductance plate 1104 is configured as a circular plate having a donut shape (ring shape) in which a hole accommodating the wafer 200 is installed in an inner peripheral portion. In an outer peripheral portion of the conductance plate 1104, a plurality of discharge ports 1104a arranged in a circumferential direction are installed at predetermined intervals. The discharge port 1104a is intermittently formed such that the outer peripheral portion of the conductance plate 1104 is able to support the inner peripheral portion of the conductance plate 1104.

Meanwhile, a lower plate 1105 is engaged with an outer peripheral portion of the support table 1103. The lower plate 1105 includes a concave portion 1105b having a ring shape and a flange portion 1105a integrally installed in an inner upper portion of the concave portion 1105b. The concave portion 1105b is installed so as to close a gap between an outer peripheral portion of the support table 1103 and the inner wall side surface of the process chamber 1101. In a portion near the exhaust port 1160 out of a bottom of the concave portion 1105b, a plate exhaust port 1105c configured to exhaust (distribute) a gas from an inside of the concave portion 1105b to the exhaust port 1160 side is installed. The flange portion 1105a functions as an engaging unit engaging with an upper outer periphery of the support table 1103. When the flange portion 1105a is engaged with the upper outer periphery of the support table 1103, the lower plate 1105 is raised or lowered together with the support table 1103 according to raising or lowering of the support table 1103.

When the support table 1103 is raised to the wafer processing location, the lower plate 1105 is also raised to the wafer processing location. As a result, the conductance plate 1104 maintained near the wafer processing location blocks a top surface portion of the concave portion 1105b of the lower plate 1105, and an exhaust duct 1159 having the inside of the concave portion 1105b as a gas flow path region is formed. Also, at this time, by the exhaust duct 1159 [the conductance plate 1104 and the lower plate 1105] and the support table 1103, the inside of the process chamber 1101 is divided into an upper process chamber above the exhaust duct 1159 and a lower process chamber below the exhaust duct 1159. Also, in consideration of etching reaction by-products deposited in an inner wall of the exhaust duct 1159 (when self-cleaning is performed), the conductance plate 1104 and the lower plate 1105 may be preferably made of a material that can be maintained at a high temperature, for example, quartz resistant to a high temperature and a high load.

Here, a gas flow in the process chamber 1101 when the wafer is processed will be described. First, a gas supplied from the gas inlet 1110 to an upper portion of the shower head 1140 enters the second buffer space 1140d from a plurality of holes of the shower plate 1140a via the first buffer space 1140c (dispersion chamber), is supplied into the process chamber 1101 through a plurality of holes of the shower plate 1140b, and is uniformly supplied onto the wafer 200. Then, the gas supplied onto the wafer 200 radially flows toward the outside of the wafer 200 in a radial direction. Then, a surplus gas that has come in contact with the wafer 200 radially flows over the exhaust duct 1159 located in an outer peripheral portion of the wafer 200, that is, over the conductance plate 1104, toward the outside of the wafer 200 in a radial direction, and is exhausted from the discharge port 1104a installed in the conductance plate 1104 into a gas flow path region [into the concave portion 1105b] in the exhaust duct 1159. Then, the gas flows into the exhaust duct 1159 and is exhausted to the exhaust port 1160 via the plate exhaust port 1105c. When the gas flows in this way, wraparound of the gas to the lower process chamber, that is, a rear surface of the support table 1103 or a bottom side of the process chamber 1101, is suppressed. Also, the above gas supply unit is connected to the first PM, the second PM, the third PM, and the fourth PM, and thereby the above substrate processing process may be performed on the wafer 200.

Also, here, while the example in which four process chambers are installed has been described, the present invention is not limited thereto. By increasing the number of angles of the transfer container having a polygonal shape, five or more process chambers may be installed. A plurality of process chambers may be provided in a side of the transfer container having a polygonal shape.

Third Embodiment

Figure 19:
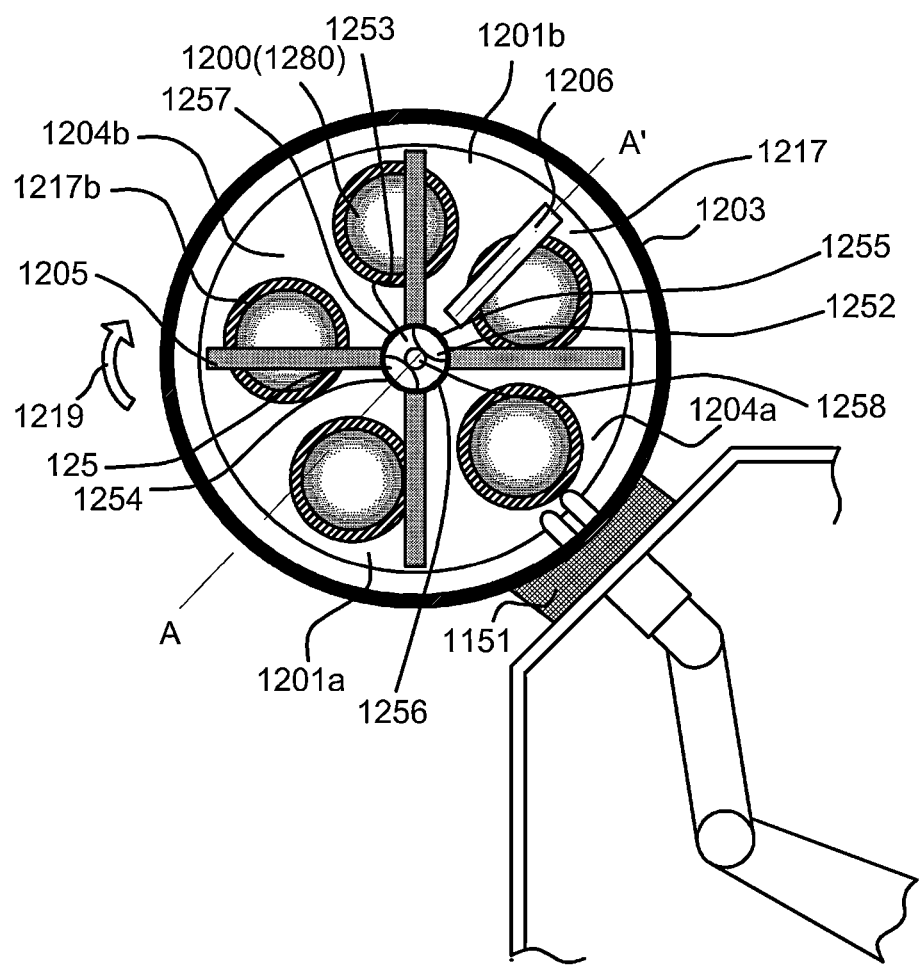
FIG. 19 is a partial plane cross-sectional view illustrating a process container preferably used in a third embodiment of the present invention.
Figure 20:
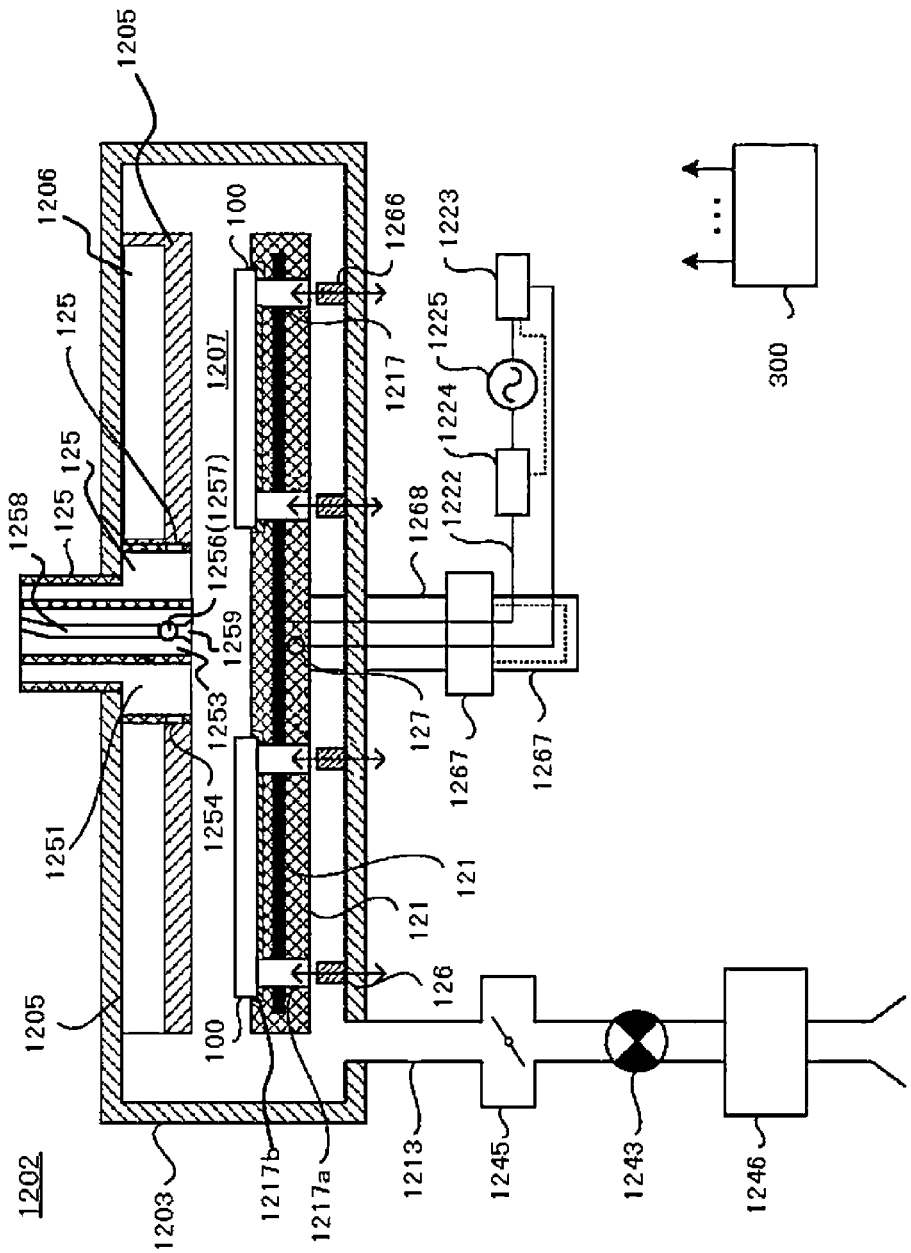
FIG. 20 is a partial vertical cross-sectional view illustrating a process container preferably used in the third embodiment of the present invention.

Hereinafter, the third embodiment will be described with reference to FIGS. 19 and 20. As illustrated in FIG. 19, the present embodiment has a form in which, in the process chamber that is divided into a plurality of sections, a plurality of wafers 200 are accommodated and processed on the substantially the same surface. A configuration of a process chamber 1202 as a processing furnace according to the present embodiment will be described with reference to FIGS. 19 and 20. FIG. 19 is a schematic perspective view of a reaction container according to the present embodiment. FIG. 19 is a schematic cross-sectional view of a processing furnace according to the present embodiment. FIG. 20 is a vertical cross-sectional view of a processing furnace according to the present embodiment and is a cross-sectional view of the processing furnace illustrated in FIG. 19 taken along the line A-A'.

Reaction Chamber

As illustrated in FIGS. 19 and 20, the process chamber 1202 serving as a processing furnace includes a reaction container 1203 that is a cylindrical airtight container. The processing space 1207 of the substrate 100 is formed in the reaction container 1203. Four partition plates 1205 radially extending from a center portion are installed above the processing space 1207 in the reaction container 1203. The four partition plates 1205 are configured to divide the processing space 1207 into a first processing region 1201a, a first purge region 1204a, a second processing region 1201b, and a second purge region 1204b. Also, the first processing region 1201a, the first purge region 1204a, the second processing region 1201b, and the second purge region 1204b are arranged sequentially in a rotation direction of a susceptor 1217 (substrate placing table) (to be described later).

By rotating the susceptor 1217, a substrate 1200 placed on the susceptor 1217 sequentially moves through the first processing region 1201a, the first purge region 1204a, the second processing region 1201b, and the second purge region 1204b. Also, a first processing gas (source gas) is supplied into the first processing region 1201a, a second processing gas (reaction gas) is supplied into the second processing region 1201b, and the inert gas is supplied into the first purge region 1204a and the second purge region 1204b. Accordingly, by rotating the susceptor 1217, the first processing gas (source gas), the inert gas, the second processing gas (reaction gas), and the inert gas are sequentially supplied onto the substrate 100.

A gap having a predetermined width is provided between an end of the partition plate 1205 and a sidewall of the reaction container 1203, and the gas passes through this gap. When the inert gas is ejected from an inside of the first purge region 1204a and an inside of the second purge region 1204b into the first processing region 1201a and the second processing region 1201b through this gap, it is possible to prevent the processing gas from being introduced into the first purge region 1204a and the second purge region 1204b, thereby preventing a reaction of the processing gas.

Also, in the present embodiment, an angle between the partition plates 1205 is set to 90° C., but the present invention is not limited thereto. That is, in consideration of a supply time of various gases to the substrate 100 and the like, the angle may be appropriately changed. For example, an angle between two partition plates 1205 forming the second processing region 1201b may be increased.

Also, each processing region is divided by the partition plate 1205, but the present invention is not limited thereto. A configuration in which gases supplied to the processing regions 1201a and 1201b are not mixed may be used.

Susceptor

As illustrated in FIGS. 19 and 20, in a lower side of the partition plate 1205, that is, a bottom center in the reaction container 1203, the susceptor 1217, which includes a center of a rotation shaft in a center of the reaction container 1203 and is rotatably configured, is installed as a substrate support portion. In order to reduce metal contamination of the substrate 1200, the susceptor 1217 is made of a non-metal material such as aluminum nitride (AlN), a ceramic, and quartz. Also, the susceptor 1217 and the reaction container 1203 are electrically insulated.

The susceptor 1217 is configured to support a plurality of substrates 100 (five in the present embodiment) by being arranged on the same surface or the same circumference in the reaction container 1203. Here, the term "on the same surface" is not limited to a complete same surface, and it is sufficient if the plurality of substrates 100 are arranged so as not to overlap when the susceptor 121 is seen from a top surface as illustrated in FIGS. 19 and 20.

Also, in a support location of the substrate 100 in a surface of the susceptor 1217, a substrate placing unit 1217b is concentrically installed to correspond to the number of substrates 100 to be processed. For example, each substrate placing unit 1217b may have a circle shape as seen from a top surface and a concave shape as seen from a side surface. In this case, it is preferable that a diameter of the substrate placing unit be set to be slightly greater than a diameter of the substrate 100. By placing the substrate 100 in the substrate placing unit, it is possible to easily determine a location of the substrate 100, and it is possible to prevent location displacement occurring when the substrate 100 protrudes from the susceptor 1217 due to centrifugal force generated by rotation of the susceptor 1217.

As illustrated in FIG. 20, a lifting mechanism 1268 configured to raise or lower the susceptor 1217 is installed in the susceptor 1217. A plurality of through-holes 1217a are installed in the susceptor 1217. In a bottom of the above reaction container 1203, a plurality of substrate push-up pins 1266 configured to support a rear surface of the substrate 100 by raising and lowering the substrate 100 when the substrate 100 is loaded into or unloaded from the reaction container 1203 are installed. The through-holes 1217a and the substrate push-up pins 1266 are disposed such that, when the substrate push-up pin 1266 is raised or when the susceptor 1217 is lowered by the lifting mechanism 1268, the substrate push-up pin 1266 passes through the through-hole 1217a while not in contact with the susceptor 1217.

In the lifting mechanism 1268, a rotating mechanism 1267 configured to rotate the susceptor 1217 is installed. A rotation shaft (not illustrated) of the rotating mechanism 1267 is connected to the susceptor 1217. By operating the rotating mechanism 1267, the susceptor 1217 is rotatably configured. In the rotating mechanism 1267, a controller 300 is connected through a coupling section 1267a. The coupling section 1267a is configured as a slip ring mechanism that electrically connects between a rotating side and a fixed side by a metal brush and like. Accordingly, rotation of the susceptor 1217 is not interfered with. The controller 300 is configured to control power supply to the rotating mechanism 1267 such that the susceptor 1217 is rotated for a predetermined time at a predetermined rate. As described above, by rotating the susceptor 1217, the substrate 100 placed on the susceptor 1217 sequentially moves through the first processing region 1201a, the first purge region 1204a, the second processing region 1201b, and the second purge region 1204b.

Heating Unit

A heater 1218 serving as a heating unit is integrally embedded in the susceptor 1217 and is configured to heat the substrate 100. When power is supplied to the heater 1218, the surface of the substrate 100 is heated to a predetermined temperature (for example, about room temperature to 1,000° C.). Also, in order to individually heat each substrate 100 placed on the susceptor 1217, a plurality of heaters 1218 may be installed on the same surface (for example, five).

A temperature sensor 1274 is installed in the susceptor 1217. A temperature regulator 1223, a power conditioner 1224, and a heater power source 1225 are electrically connected to the heater 1218 and the temperature sensor 1274 through a power supply line 1222. Based on information on the temperature detected by the temperature sensor 1274, power supply to the heater 1218 is controlled.

Gas Supply Unit

In an upper side of the reaction container 1203, a gas supply unit 1250 including a first processing gas inlet 1251, a second processing gas inlet 1252, an inert gas inlet 1253, and a cleaning gas inlet 1258 is installed. The gas supply unit 1250 is hermetically installed in an opening that is opened upward with respect to the reaction container 1203. A first gas outlet 1254 is installed in a sidewall of the first processing gas inlet 1251. A second gas outlet 1255 is installed in a sidewall of the second processing gas inlet 1252. A first inert gas outlet 1256 and a second inert gas outlet 1257 are installed in a sidewall of the inert gas inlet 1253 so as to face each other. In a bottom of the gas supply unit 1250, a cleaning gas supply hole 1259, which is an end of the cleaning gas inlet 1258, is installed. That is, the cleaning gas supply hole 1259 is installed in a location lower than that of the first gas outlet 1254, the second gas outlet 1255, and the inert gas outlets 1256 and 1257.

The gas supply unit 1250 supplies the first processing gas from the first processing gas inlet 1251 into the first processing region 1201a, supplies the second processing gas from the second processing gas inlet 1252 into the second processing region 1201b, and supplies the inert gas from the inert gas inlet 1253 into the first purge region 1204a and the second purge region 1204b. The gas supply unit 1250 may separately supply each processing gas and the inert gas to each region without mixing the gases, and may supply each processing gas and the inert gas together to each region.

Here, as the first processing gas, the $TiCl_4$ is used as a transition metal-containing gas described in the first embodiment. As the second processing gas, the $NH_3$ gas is used as the reaction gas described in the first embodiment. By rotating the susceptor 1217, the substrate is sequentially exposed to step (S104) (supply of the $TiCl_4$ gas), step (S105) (supply of the inert gas), step (S106) (supply of the $NH_3$ gas), and step (S107) (supply of the inert gas), and a process of forming the TiN film in the first embodiment may be performed. By rotating the susceptor a predetermined number of times, it is possible to form a transition metal nitride film (TiN film) having a predetermined film thickness. Also, a timing at which the susceptor 1217 is rotated is controlled such that, in each section, after step (S104), step (S105), step (S106), and step (S107) in the first embodiment are terminated, rotation is performed. In such a configuration, since switching of the atmosphere in the process chamber 201 is unnecessary, it is possible to improve processing throughput.

Also, control may be performed as follows. Step (S104) is performed such that the first processing gas and the second processing gas are used as the source gas, and rotation is performed a predetermined number of times. Step (S105) is performed such that the first processing gas and the second processing gas are switched to the purge gas and rotation is performed a predetermined number of times. Step (S106) is performed such that the first processing gas and the second processing gas are switched to the reaction gas and rotation is performed a predetermined number of times. Step (S107) is performed such that the first processing gas and the second processing gas are switched to the purge gas and rotation is performed a predetermined number of times. By controlling in this manner, processing may be performed similar to the first embodiment.

Fourth Embodiment

Figure 21:
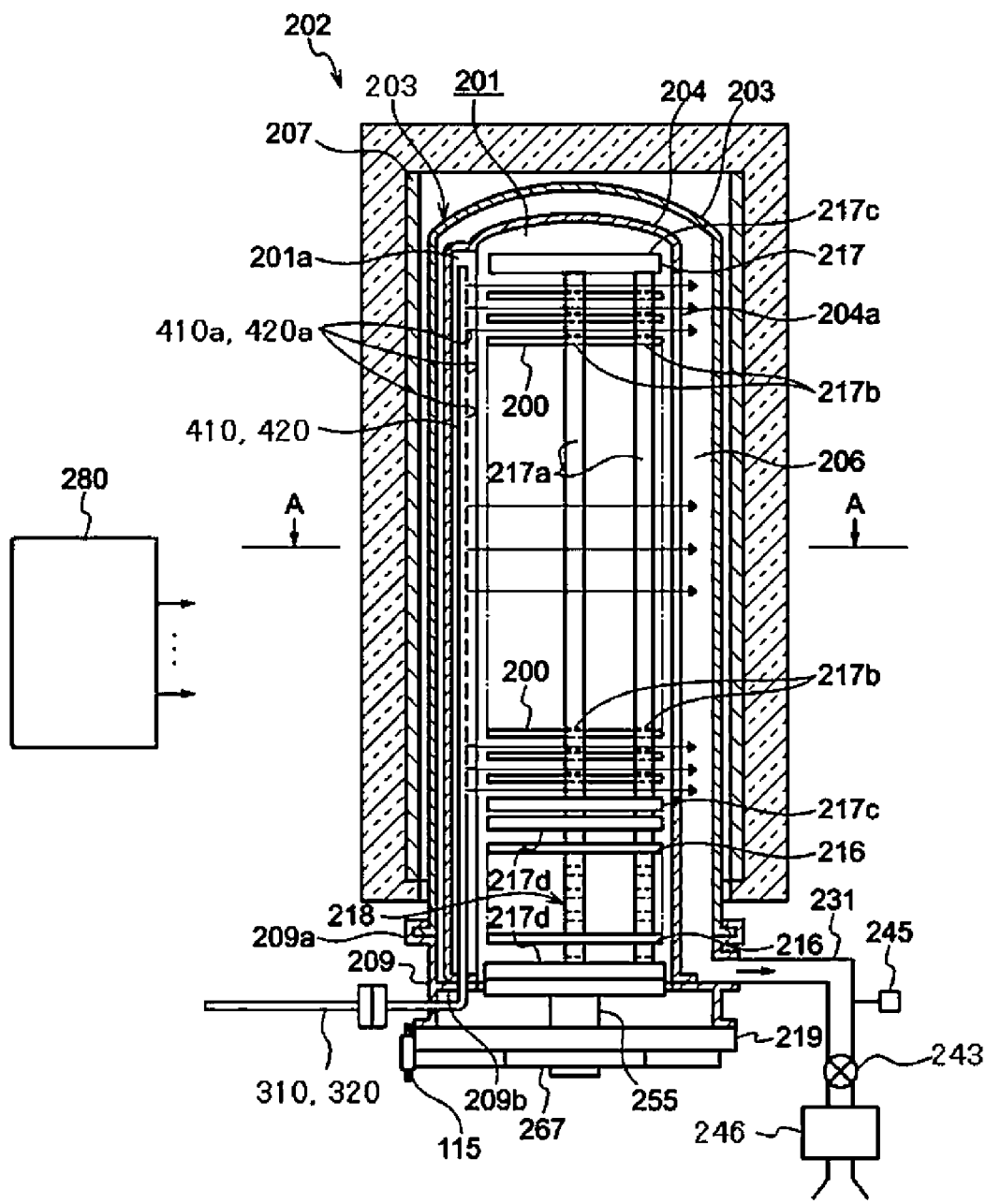
FIG. 21 is a partial vertical cross-sectional view illustrating a process container preferably used in a fourth embodiment of the present invention.

Hereinafter, the fourth embodiment will be described with reference to FIG. 21 focusing on only portions different from the first embodiment. As illustrated in FIG. 21, in the present embodiment, when the reaction container 203 is installed as an outer tube, an inner tube 204 is installed in an inner side of the reaction container 203. Each nozzle is configured to supply a gas into the inner tube 204. The gas is supplied to the wafer 200, and then is exhausted from the exhaust pipe 231 through an exhaust port 204a installed in a location facing each nozzle. When processing is performed by a processing device having such a configuration, as indicated by an arrow in FIG. 21, it is possible to maintain a gas flow parallel to the substrate and reduce a loading effect, thereby improving process uniformity at the surface of the wafer 200. Also, even when a plurality of wafers 200 are vertically placed in multiple stages, since the gas can be uniformly supplied to each wafer 200, it is possible to reduce the loading effect of each wafer 200.

Fifth Embodiment

Hereinafter, the fifth embodiment will be described, focusing on only portions different from the first to fourth embodiments. The present embodiment has a difference from the first to fourth embodiments in that a gas storage unit (gas tank) capable of storing a predetermined amount of a gas is installed in a gas supply pipe configured to supply a source gas and/or a reaction gas. The gas supply pipe having the gas storage unit installed therein may be applied to the first to fourth embodiments. The gas supply pipe having the gas storage unit installed therein may be applied to either or both of a gas supply pipe configured to supply the source gas and a gas supply pipe configured to supply the reaction gas. When a predetermined amount of the source gas and/or the reaction gas is stored in the gas storage unit and the source gas and/or the reaction gas is supplied into the process chamber 201, if supply (flush supply) from the gas storage unit is performed, it is possible to supply the source gas and/or the reaction gas more than in instantaneous supply to the wafer 200. In this way, it is possible to reduce a time for supplying each gas in temporally separated pulses. Also, the gas storage unit storing $TiCl_4$ gas is heated to about 150° C. in advance. In addition, when a plurality of gas supply pipes are installed for a kind of a gas and a separate gas storage unit is installed for each gas supply pipe, it is possible to further reduce a time for supplying each gas in temporally separated pulses than when the gas storage unit is installed in parallel.

Sixth Embodiment

Hereinafter, the sixth embodiment will be described, focusing on portions different from the fifth embodiment. In the fifth embodiment, the gas storage unit capable of storing a predetermined amount of a gas is installed in the gas supply pipe configured to supply the source gas and/or the reaction gas. However, in the present embodiment, instead of the gas storage unit, the MFC installed in the gas supply pipe adjusts flush supply of each gas. Accordingly, it is possible to reduce a time for supplying each gas in temporally separated pulses.

Other Embodiment

Hereinafter, other embodiments will be described. While the above embodiments describe the example in which $TiCl_4$ is used as the source gas, the present invention is not limited thereto. For example, tetrakis(ethylmethylamino)titanium ($Ti[N(C_2H_5)(CH_3)]_4$, abbreviated to: TEMAT), tetrakis(dimethylamino)titanium ($Ti[N(CH_3)_2]_4$, abbreviated to: TDMAT), tetrakis(diethylamino)titanium ($Ti[N(C_2H_5)_2]_4$, abbreviated to: TDEAT), and the like may be used. Also, while the case in which $NH_3$ is used as the reaction gas has been described, the invention is not limited thereto. For example, diazene ($N_2H_2$) gas, hydrazine ($N_2H_4$) gas, $N_3H_8$ gas, and the like may be used as a nitriding gas (nitrogen-containing gas).

Also, the gases are not limited to those described herein. As the source gas, a gas containing at least one halogen out of fluorine (F), chlorine (Cl), bromine (Br), and iodine (I) may be supplied. As the reaction gas, a gas containing either or both of hydrogen and oxygen may be supplied. As the reaction gas, a gas containing either or both of hydrogen and carbon may also be supplied. When such source gases and reaction gases are used, by-products interfering with the above main reaction are generated.

Also, in the above embodiments, while the process of forming the TiN film as a conductive film has been described, the present invention is not limited thereto. For example, any or two or more of TaN, WN, TiAlC, TaAlC, WC, TiC, TaC, WAlC, WSiN, WBC, WSiBN, WBCN, Ni, Ru, Co, and SiC may be formed.

While the above embodiments use the $N_2$ gas as the inert gas, the inert gas is not limited thereto but a rare gas such as argon (Ar) gas, helium (He) gas, neon (Ne) gas, and xenon (Xe) gas may be used. Also, hydrogen ($H_2$) gas may be used with a film with which hydrogen gas does not react.

Also, the present invention is not limited to film-forming of the conductive film but may be applied to film-forming of an insulation film such as silicon oxide (SiO), silicon nitride (SiN), aluminum oxide (AlO), hafnium oxide (HfO), and zirconium oxide (ZrO).

Also, in the present invention, while the method in which the $TiCl_4$ gas is generated by bubbling $TiCl_4$ using the vaporizing unit has been described, the invention is not limited thereto. A vaporizer configured to vaporize a liquid source by supplying a sprayed liquid source to a heating body and a vaporizer configured to vaporize by spraying in a reduced-pressure atmosphere may also be used.

Also, in the present invention, the example in which both the $TiCl_4$ gas and the $NH_3$ gas are supplied in temporally separated pulses has been described. However, since the $NH_3$ gas greatly contributes to addressing the loading effect, which is an object to the present invention, intermittent supply may be performed only when the $NH_3$ gas is supplied.

Also, the present invention may be implemented by, for example, changing a process recipe by modifying a gas supply system of an existing substrate processing apparatus in a manufacturing factory of the semiconductor device. In order to change the process recipe, the process recipe according to the present invention may be installed in the existing substrate processing apparatus through telecommunication lines or a recording medium storing the process recipe, or the process recipe itself may be changed to the process recipe according to the present invention by manipulating an I/O device of the existing substrate processing apparatus.

As described above, while film-forming technology has been described in various exemplary embodiments of the present invention, the present invention is not limited to such embodiments. For example, the present invention can be applied to a film-forming process of forming various films such as an oxide film, a nitride film, and a metal film, and other substrate processing such as a diffusing reaction, an oxidizing reaction, and a nitriding reaction. In addition, the present invention may also be applied to other substrate processing apparatuses such as a thin film forming apparatus, an etching apparatus, an oxidizing reaction apparatus, and a nitriding reaction apparatus. Also, in the present invention, these apparatuses may be mixed.

According to the present invention, it is possible to improve quality or manufacturing throughput of a semiconductor device.

Exemplary Embodiments

Hereinafter, preferred embodiments of the present invention will be added.
Supplementary Note 1

According to an embodiment of the present invention, there is provided a method of manufacturing a semiconductor device, comprising: (a) supplying a source gas to a substrate in a process chamber; (b) exhausting an inside of the process chamber; (c) supplying a reaction gas to the substrate; and (d) exhausting the inside of the process chamber, wherein at least one of the source gas and the reaction gas is supplied in temporally separated pulses to form a film on the substrate during a gas supply period determined by a concentration distribution of by-products formed on the substrate at a surface of the substrate in at least one of the step (a) and the step (c).
Supplementary Note 2

It is preferable that at least one of the source gas and the reaction gas is supplied in temporally separated pulses until a concentration of the by-products at the surface of the substrate reaches a predetermined concentration in at least one of the step (a) and the step (c).
Supplementary Note 3

It is preferable that a supply of the source gas and an exhaust of the inside of the process chamber are alternately performed a plurality of times when the source gas is supplied in temporally separated pulses, and a supply of the reaction gas and an exhaust of the inside of the process chamber are alternately performed a plurality of times when the reaction gas is supplied in temporally separated pulses.

Supplementary Note 4

It is preferable that each exhaust of the inside of the process chamber is performed at least for a time period required for removing the by-products.

Supplementary Note 5

It is preferable that each exhaust of the inside of the process chamber includes at least one of a vacuum exhaust and a gas purge by an inert gas supply.

Supplementary Note 6

It is preferable that the exhaust of the inside of the process chamber is sequentially performed at least once when the source gas and/or the reaction gas is supplied in temporally separated pulses.

Supplementary Note 7

It is preferable that the source gas includes a halide.

Supplementary Note 8

It is preferable that the source gas is a chloride.

Supplementary Note 9

It is preferable that the source gas includes a metal-containing gas.

Supplementary Note 10

It is preferable that the reaction gas includes hydrogen and at least one of nitrogen, oxygen and carbon.

Supplementary Note 11

It is preferable that the metal-containing gas includes a titanium-containing gas, and the reaction gas includes an ammonia gas.

Supplementary Note 12

According to an embodiment of the present invention, there is provided a method of manufacturing a semiconductor device, the method including: (a) supplying a source gas to a substrate in a process chamber; (b) exhausting an inside of the process chamber; (c) supplying a reaction gas to the substrate; and (d) exhausting the inside of the process chamber, wherein at least one of the source gas and the reaction gas is supplied a plurality of times to form a film on the substrate during a gas supply time determined by a concentration distribution of by-products formed on a surface of the substrate in at least one of the step (a) and the step (c).

Supplementary Note 13

According to another embodiment of the present invention, there is provided a method of manufacturing a semiconductor device, comprising: (a) supplying a source gas to a substrate in a process chamber; (b) exhausting an inside of the process chamber; (c) supplying a reaction gas to the substrate; and (d) exhausting the inside of the process chamber, wherein at least one of the source gas and the reaction gas is intermittently supplied to form a film on the substrate during a gas supply period determined by a concentration distribution of by-products formed on a surface of the substrate in at least one of the step (a) and the step (c).

Supplementary Note 14

According to another embodiment of the present invention, there is provided a method of manufacturing a semiconductor device, the method including: a source gas supply step of supplying a source gas to a substrate accommodated in a process chamber; and a reaction gas supply step supplying a reaction gas to the substrate, wherein the method further includes either or both of: a step of temporarily suspending a supply of the source gas to the substrate and removing by-products during the source gas supply step; and a step of temporarily suspending a supply of the reaction gas to the substrate and removing by-products during the reaction gas supply step.

Supplementary Note 15

According to another embodiment of the present invention, there is provided a substrate processing apparatus, including: a process chamber configured to accommodate a substrate; a source gas supply system configured to supply a source gas to the substrate; a reaction gas supply system configured to supply a reaction gas to the substrate; an exhaust system configured to exhaust an inside of the process chamber; and a controller configured to control the source gas supply system, the reaction gas supply system and the exhaust system to perform (a) supplying the source gas to the substrate accommodated in the process chamber, (b) exhausting the inside of the process chamber, (c) supplying the reaction gas to the substrate and (d) exhausting the inside of the process chamber, wherein at least one of the source gas and the reaction gas is supplied in temporally separated pulses to form a film on the substrate during a gas supply period determined by a concentration distribution of by-products formed on a surface of the substrate in at least one of the step (a) and the step (c).

Supplementary Note 16

According to another embodiment of the present invention, there is provided a program causing a computer to execute: (a) supplying a source gas to a substrate in a process chamber; (b) exhausting an inside of the process chamber; (c) supplying a reaction gas to the substrate; and (d) exhausting the inside of the process chamber, wherein at least one of the source gas and the reaction gas is supplied in temporally separated pulses to form a film on the substrate during a gas supply period determined by a concentration distribution of by-products formed on a surface of the substrate in at least one of the step (a) and the step (c).

Supplementary Note 17

According to another embodiment of the present invention, there is provided a non-transitory computer-readable recording medium storing a program causing a computer to execute: (a) supplying a source gas to a substrate in a process chamber; (b) exhausting an inside of the process chamber; (c) supplying a reaction gas to the substrate; and (d) exhausting the inside of the process chamber, wherein at least one of the source gas and the reaction gas is supplied in temporally separated pulses to form a film on the substrate during a gas supply period determined by a concentration distribution of by-products formed on a surface of the substrate in at least one of the step (a) and the step (c).

What is claimed is:

1. A method of manufacturing a semiconductor device, comprising:
    (a) performing:
        (a-1) supplying a source gas to a substrate in a process chamber;
        (a-2) exhausting an inside of the process chamber;
        (a-3) supplying a reaction gas to the substrate; and
        (a-4) exhausting the inside of the process chamber in order to form a first film on the substrate; and
    b) alternately repeating a first cycle and a second cycle to form a second film on the first film, wherein the first cycle comprises alternately repeating: (b-1) supplying the source gas to the substrate; and (b-2) exhausting the inside of the process chamber, and the second cycle comprises alternately repeating: (b-3) supplying the reaction gas to the substrate; and (b-4) exhausting the inside of the process chamber.

2. The method of claim 1, wherein each exhaust of the inside of (a-2), (a-4), (b-2) and (b-4) comprises at least one of a vacuum exhaust and a gas purge by an inert gas supply.

3. The method of claim 1, wherein a duration of (b-2) increases as (b-2) is repeated in the first cycle, or a duration of (b-4) increases as (b-4) is repeated in the second cycle.

4. The method of claim 1, wherein the source gas is continuously supplied in (b-2) at a flow rate lower than a flow rate of the source gas supplied in (b-1).

5. The method of claim 4, wherein a flow rate of the source gas supplied in (b-2) increases as (b-2) is repeated in the first cycle.

6. The method of claim 1, wherein the reaction gas is continuously supplied in (b-4) at a flow rate lower than a flow rate of the reaction gas supplied in (b-3).

7. The method of claim 6, wherein a flow rate of the reaction gas supplied in (b-4) increases as (b-4) is repeated in the second cycle.

8. The method of claim 1, wherein the substrate comprises a pattern thereon.

\* \* \* \* \*